US009919949B2

(12) United States Patent
Kawamoto et al.

(10) Patent No.: US 9,919,949 B2
(45) Date of Patent: Mar. 20, 2018

(54) STRENGTHENED GLASS, STRENGTHENED GLASS PLATE, STRENGTHENED GLASS CONTAINER, AND GLASS FOR STRENGTHENING

(71) Applicant: Nippon Electric Glass Co., Ltd., Shiga (JP)

(72) Inventors: Kosuke Kawamoto, Shiga (JP); Ken Choju, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 183 days.

(21) Appl. No.: 14/651,368

(22) PCT Filed: Dec. 18, 2013

(86) PCT No.: PCT/JP2013/083851
§ 371 (c)(1),
(2) Date: Jun. 11, 2015

(87) PCT Pub. No.: WO2014/098111
PCT Pub. Date: Jun. 26, 2014

(65) Prior Publication Data
US 2015/0329406 A1    Nov. 19, 2015

(30) Foreign Application Priority Data

Dec. 21, 2012  (JP) ................................. 2012-279292
Aug. 23, 2013  (JP) ................................. 2013-172830

(51) Int. Cl.
B32B 15/04       (2006.01)
B32B 17/06       (2006.01)
(Continued)

(52) U.S. Cl.
CPC ................. *C03C 3/083* (2013.01); *A61J 1/00* (2013.01); *C03C 3/091* (2013.01); *C03C 4/18* (2013.01);
(Continued)

(58) Field of Classification Search
USPC ................................. 428/409, 410, 426, 432
See application file for complete search history.

(56) References Cited

U.S. PATENT DOCUMENTS 5,277,946 A       1/1994  Nagai et al.
2003/0012936 A1*  1/2003  Draheim .............. C08F 2/44
                                              428/216
(Continued)

FOREIGN PATENT DOCUMENTS

JP       3-237036     10/1991
JP       2006-83045    3/2006
(Continued)

OTHER PUBLICATIONS

International Preliminary Report on Patentability dated Jun. 23, 2015 in International Application No. PCT/JP2013/083851.
(Continued)

*Primary Examiner* — Lauren R Colgan
(74) *Attorney, Agent, or Firm* — Wenderoth, Lind & Ponack, L.L.P.

(57) ABSTRACT

To devise a tempered glass and a glass to be tempered each of which is lowered in density and viscosity at high temperature, hardly deteriorates a $KNO_3$ molten salt, and is excellent in thermal shock resistance. The tempered glass having a compression stress layer in a surface thereof, including as a glass composition, in terms of mol %, 50 to 80% of $SiO_2$, 5 to 30% of $Al_2O_3$, 0 to 2% of $Li_2O$, 5 to 25% of $Na_2O$, and 0 to 5% of $K_2O$, and being substantially free of $As_2O_3$, $Sb_2O_3$, PbO, and F.

24 Claims, 1 Drawing Sheet

(51) Int. Cl.
*C03C 3/083* (2006.01)
*G06F 3/041* (2006.01)
*A61J 1/00* (2006.01)
*H01L 31/02* (2006.01)
*H04B 1/3888* (2015.01)
*C03C 4/18* (2006.01)
*C03C 3/091* (2006.01)
*C03C 21/00* (2006.01)
*A61J 1/06* (2006.01)

(52) U.S. Cl.
CPC ............ *C03C 21/002* (2013.01); *G06F 3/041* (2013.01); *H01L 31/02* (2013.01); *H04B 1/3888* (2013.01); *A61J 1/065* (2013.01); *C03C 2204/00* (2013.01); *Y10T 428/13* (2015.01); *Y10T 428/315* (2015.01)

(56) References Cited

U.S. PATENT DOCUMENTS

| | | | |
|---|---|---|---|
| 2006/0063009 A1 | 3/2006 | Naitou et al. | |
| 2009/0142568 A1* | 6/2009 | Dejneka | C03C 3/091 428/220 |
| 2009/0197048 A1* | 8/2009 | Amin | C03C 3/085 428/142 |
| 2009/0220761 A1 | 9/2009 | Dejneka et al. | |
| 2012/0196110 A1* | 8/2012 | Murata | C03B 25/08 428/220 |
| 2013/0011650 A1 | 1/2013 | Akiba et al. | |
| 2013/0045371 A1* | 2/2013 | O'Donnell | C09J 7/0296 428/215 |
| 2013/0199950 A1* | 8/2013 | Feller | C09J 7/02 206/223 |
| 2014/0106172 A1* | 4/2014 | Dejneka | C03C 3/093 428/410 |

FOREIGN PATENT DOCUMENTS

| | | |
|---|---|---|
| JP | 2012-180270 | 9/2012 |
| KR | 10-2012-0089233 | 8/2012 |
| TW | 200948738 | 12/2009 |
| WO | 2011/006031 | 1/2011 |

OTHER PUBLICATIONS

International Search Report dated Mar. 25, 2014 in International (PCT) Application No. PCT/JP2013/083851.
F. G. Wissman et al., "Properties of Chemically Strengthened Glasses", The Soviet Journal of Glass Physics and Chemistry, vol. 6, No. 4, pp. 285-291, Jul.-Aug. 1980.
T. Izumitani et al., "New Glass and Physical Properties Thereof", First Edition, Management System Laboratory Co. Ltd., pp. 451-498, Aug. 20, 1984 (Partial Translation).
Office Action dated Feb. 10, 2017 in corresponding Taiwanese Application No. 102147337, with English translation of the Search Report.

* cited by examiner

STRENGTHENED GLASS, STRENGTHENED GLASS PLATE, STRENGTHENED GLASS CONTAINER, AND GLASS FOR STRENGTHENING

TECHNICAL FIELD

The present invention relates to a tempered glass, a tempered glass sheet, and a glass to be tempered, in particular, to a tempered glass, a tempered glass sheet, and a glass to be tempered suitable for a cover glass for a cellular phone, a digital camera, a personal digital assistant (PDA), or a solar battery, or a glass substrate for a display, in particular, a touch panel display. Further, the present invention relates to a tempered glass container, in particular, a tempered glass container for use as a container for pharmaceuticals.

BACKGROUND ART

Devices such as a cellular phone, a digital camera, a PDA, a touch panel display, a large-screen television, and contactless power transfer show a tendency of further prevalence.

A tempered glass, which is produced by applying tempering treatment to glass through ion exchange treatment or the like, is used for those applications (see Patent Literature 1 and Non Patent Literature 1).

In addition, in recent years, the tempered glass has been more and more frequently used in exterior parts of, for example, digital signage, mice, and smartphones.

A related-art device includes a display module, a touch panel sensor, and the tempered glass (protective member). In recent years, a method involving forming the touch panel sensor on the tempered glass has started to be adopted in order to achieve a reduction in weight or a reduction in thickness. As a result, such protective member is required to: (1) have high mechanical strength; (2) have high flaw resistance; (3) be less costly; (4) have low density; (5) have sufficiently high acid resistance for preventing denaturation of its surface in acid treatment at the time of formation of the touch panel sensor; and (6) be free of a substance having a high environmental load.

CITATION LIST

Patent Literature

[PTL 1] JP 2006-83045 A

Non Patent Literature

[NPL 1] Tetsuro Izumitani et al., "New glass and physical properties thereof," First edition, Management System Laboratory. Co., Ltd., Aug. 20, 1984, p. 451-498

SUMMARY OF INVENTION

Technical Problem

Incidentally, when the content of $Li_2O$ in a glass composition is increased, viscosity at high temperature can be lowered while ion exchange performance is enhanced. However, when the content of $Li_2O$ is increased and ion exchange treatment is performed using a potassium nitrate molten salt ($KNO_3$ molten salt), a Li ion is liable to be mixed in the $KNO_3$ molten salt. The $KNO_3$ molten salt having mixed therein the Li ion makes it difficult to enhance the tempering characteristic of a glass to be tempered. As a result, the $KNO_3$ molten salt needs to be frequently replaced, and hence the productivity of a tempered glass is liable to lower. Further, when the content of $Li_2O$ is increased, liquidus viscosity is liable to lower. It should be noted that a Na ion also has property of deteriorating the $KNO_3$ molten salt, but the degree of the deterioration is lower than that in the case of the Li ion.

In addition, hitherto, as the glass to be tempered, there has been proposed a glass containing large amounts of $Na_2O$ and $K_2O$ in its glass composition. However, $Na_2O$ and $K_2O$ are each a component that increases density. Meanwhile, when the contents of $Na_2O$ and $K_2O$ are decreased in order to lower the density, the viscosity at high temperature increases, with the result that the productivity of the glass is liable to lower. Thus, it has been difficult to lower both the density and the viscosity at high temperature.

Further, as the content of $Li_2O$, $Na_2O$, or $K_2O$ increases, the thermal expansion coefficient of the glass to be tempered is liable to become higher. In addition, the ion exchange treatment is generally performed by immersing the glass to be tempered in a high-temperature (for example, from 300 to 500° C.) $KNO_3$ molten salt. Thus, when the $Li_2O$, $Na_2O$, or $K_2O$-rich glass is subjected to ion exchange treatment, the tempered glass is liable to undergo breakage owing to a thermal shock when the glass to be tempered is immersed in the $KNO_3$ molten salt or when the tempered glass is taken out.

In order to solve the problem, it is conceivable to employ a method involving preheating a glass sheet to be tempered before immersion in the $KNO_3$ molten salt, or annealing a tempered glass that has been taken out of an ion exchange tank. However, such method requires a long period of time, and hence involves a risk that the manufacturing cost of the tempered glass may soar.

The present invention has been made in view of the above-mentioned circumstances, and a technical object of the present invention is to devise a tempered glass and a glass to be tempered each of which is lowered in density and viscosity at high temperature, hardly deteriorates an ion exchange solution, in particular, a $KNO_3$ molten salt, and is excellent in thermal shock resistance.

Solution to Problem

The inventors of the present invention have made various studies, and as a result, have found the following. When, in a glass composition, the contents of $Al_2O_3$ and $Na_2O$ are increased, and at the same time, the contents of $Li_2O$ and $K_2O$ are decreased, and as required, $B_2O_3$ is introduced and the content of MgO is decreased, while ion exchange performance does not lower, density and viscosity at high temperature lower, property of deteriorating an ion exchange solution lowers, and thermal shock resistance improves. The finding is proposed as the present invention. Thus, the finding is proposed as the present invention. That is, a tempered glass of the present invention has a compression stress layer in a surface thereof, comprises as a glass composition, in terms of mol %, 50 to 80% of $SiO_2$, 5 to 30% of $Al_2O_3$, 0 to 2% of $Li_2O$, 5 to 25% of $Na_2O$, and 0 to 5% of $K_2O$, and is substantially free of $As_2O_3$, $Sb_2O_3$, PbO, and F. Herein, the gist of the phrase "substantially free of $As_2O_3$" resides in that $As_2O_3$ is not added positively as a glass component, but contamination with $As_2O_3$ as an impurity is allowable. Specifically, the phrase means that the content of $As_2O_3$ is less than 0.1 mol %. The gist of the phrase "substantially free of $Sb_2O_3$" resides in that $Sb_2O_3$ is not added positively as a glass component, but contamination with $Sb_2O_3$ as an impurity is allowable. Specifically, the phrase means that the content of $Sb_2O_3$ is less than 0.1 mol %. The gist of the phrase "substantially free of PbO" resides in that PbO is not added positively as a glass component, but contamination with PbO as an impurity is allowable. Specifically, the phrase means that the content of PbO is less than 0.1 mol %. The gist of the phrase "substantially free of F" resides in that F is not added positively as a glass component, but contamination with F as an impurity is allowable. Specifically, the phrase means that the content of F is less than 0.1 mol %. It should be noted that when substantial addition of $As_2O_3$, $Sb_2O_3$, PbO, and F is eliminated, a closely related environmental requirement can be satisfied.

The tempered glass of the present invention preferably comprises as a glass composition, in terms of mol %, 50 to 80% of $SiO_2$, 6.5 to 12.4% of $Al_2O_3$, 0 to 1% of $Li_2O$, 9 to 15.5% of $Na_2O$, 0 to 3.5% of $K_2O$, 0.1 to 2.5% of MgO, and 0 to 2.5% of MgO+CaO+SrO+BaO, and is preferably substantially free of $As_2O_3$, $Sb_2O_3$, PbO, and F. Herein, the term "MgO+CaO+SrO+BaO" means the total amount of MgO, CaO, SrO, and BaO.

The tempered glass of the present invention preferably comprises as a glass composition, in terms of mol %, 50 to 80% of $SiO_2$, 6.5 to 12.4% of $Al_2O_3$, 0.01 to 15% of $B_2O_3$, 0 to 1% of $Li_2O$, 9 to 15.5% of $Na_2O$, 0 to 3.5% of $K_2O$, 9 to 16.5% of $Li_2O+Na_2O+K_2O$, 0.1 to 2.5% of MgO, and 0.1 to 2.5% of MgO+CaO+SrO+BaO, and is preferably substantially free of $As_2O_3$, $Sb_2O_3$, PbO, and F. Herein, the term "$Li_2O+Na_2O+K_2O$" means the total amount of $Li_2O$, $Na_2O$, and $K_2O$.

The tempered glass of the present invention preferably comprises as a glass composition, in terms of mol %, 50 to 77% of $SiO_2$, 6.5 to 12.4% of $Al_2O_3$, 1 to 15% of $B_2O_3$, 0 to 1% of $Li_2O$, 9 to 15.5% of $Na_2O$, 0 to 3.5% of $K_2O$, 9 to 16.5% of $Li_2O+Na_2O+K_2O$, 0.1 to 2.5 of MgO, 0.1 to 2.5% of MgO+CaO+SrO+BaO, and 13 to 18.5% of $Li_2O+Na_2O+K_2O+MgO+CaO+SrO+BaO$, and is preferably substantially free of $As_2O_3$, $Sb_2O_3$, PbO, and F. Herein, the term "$Li_2O+Na_2O+K_2O+MgO+CaO+SrO+BaO$" means the total amount of $Li_2O$, $Na_2O$, $K_2O$, MgO, CaO, SrO, and BaO.

The tempered glass of the present invention preferably comprises as a glass composition, in terms of mol %, 50 to 77% of $SiO_2$, 6.5 to 12.4% of $Al_2O_3$, 1 to 10% of $B_2O_3$, 0 to 1% of $Li_2O$, 9 to 15.5% of $Na_2O$, 0 to 3.5% of $K_2O$, 9 to 16.5% of $Li_2O+Na_2O+K_2O$, 0.1 to 2.5% of MgO, 0.1 to 2.5% of MgO+CaO+SrO+BaO, and 13 to 18.5% of $Li_2O+Na_2O+K_2O+MgO+CaO+SrO+BaO$, preferably has a molar ratio $MgO/(Li_2O+Na_2O+K_2O+MgO+CaO+SrO+BaO)$ of from 0.01 to 0.2, and is preferably substantially free of $As_2O_3$, $Sb_2O_3$, PbO, and F.

The tempered glass of the present invention preferably comprises as a glass composition, in terms of mol %, 50 to 77% of $SiO_2$, 6.5 to 12.4% of $Al_2O_3$, 1 to 10% of $B_2O_3$, 0 to 1% of $Li_2O$, 9 to 15.5% of $Na_2O$, 0 to 3.5% of $K_2O$, 9 to 16.5% of $Li_2O+Na_2O+K_2O$, 0.1 to 2.5% of MgO, 0.1 to 2.5% of MgO+CaO+SrO+BaO, and 13 to 18.5% of $Li_2O+Na_2O+K_2O+MgO+CaO+SrO+BaO$, preferably has a molar ratio $MgO/(Li_2O+Na_2O+K_2O+MgO+CaO+SrO+BaO)$ of from 0.01 to 0.2 and a molar ratio $(Al_2O_3+B_2O_3)/SiO_2$ of from 0.15 to 0.30, and is preferably substantially free of $As_2O_3$, $Sb_2O_3$, PbO, and F. Herein, the term "$Al_2O_3+B_2O_3$" means the total amount of $Al_2O_3$ and $B_2O_3$.

The tempered glass of the present invention preferably has a density of 2.45 g/cm$^3$ or less. Herein, the "density" can be measured by, for example, a known Archimedes method.

When the tempered glass of the present invention is immersed in a 10 mass % aqueous hydrochloric acid solution at 80° C. for 24 hours, it is preferred that a mass reduction be 40 mg/cm$^2$ or less. Herein, the "mass reduction" is a mass reduction after immersion in the aqueous hydrochloric acid solution for 24 hours, and can be calculated by: first measuring the mass and surface area of an evaluation sample before its immersion in the aqueous hydrochloric acid solution; then measuring the mass of the evaluation sample after its immersion in the aqueous hydrochloric acid solution; and finally substituting the measured values into the following expression: (mass before immersion-mass after immersion)/(surface area before immersion).

In the tempered glass of the present invention, it is preferred that a compression stress value of the compression stress layer be 300 MPa or more, and a thickness of the compression stress layer be 10 μm or more. Herein, the "compression stress value of the compression stress layer" and the "thickness of the compression stress layer" refer to values calculated from the number of interference fringes and intervals therebetween, the interference fringes being observed when a sample is observed using a surface stress meter (for example, FSM-6000 manufactured by TOSHIBA CORPORATION).

The tempered glass of the present invention preferably has a liquidus temperature of 1,200° C. or less. Herein, the phrase "liquidus temperature" refers to a temperature at which crystals of glass are deposited after glass powder that passes through a standard 30-mesh sieve (sieve opening: 500 μm) and remains on a 50-mesh sieve (sieve opening: 300 μm) is placed in a platinum boat and then kept for 24 hours in a gradient heating furnace.

The tempered glass of the present invention preferably has a liquidus viscosity of $10^{4.0}$ dPa·s or more. Herein, the phrase "liquidus viscosity" refers to a value obtained through measurement of a viscosity of glass at the liquidus temperature by a platinum sphere pull up method.

The tempered glass of the present invention preferably has a temperature at $10^{4.0}$ dPa·s of 1,300° C. or less. Herein, the phrase "temperature at $10^{4.0}$ dPa·s" refers to a value obtained through measurement by a platinum sphere pull up method.

The tempered glass of the present invention preferably has a thermal expansion coefficient in a temperature range of from 30 to 380° C. of 90×10$^{-7}$/° C. or less. Herein, the phrase "thermal expansion coefficient in a temperature range of from 30 to 380° C." refers to a value obtained by measuring an average thermal expansion coefficient with a dilatometer.

A tempered glass sheet of the present invention preferably comprises any one of the tempered glasses.

The tempered glass sheet of the present invention preferably has a length dimension of 500 mm ox more, a width dimension of 300 mm or more, and a thickness of from 0.1 to 2.0 mm.

The tempered glass sheet of the present invention is preferably formed by an overflow down-draw method. Herein, the "overflow down-draw method" refers to a method comprising causing a molten glass to overflow from both sides of a heat-resistant forming trough, and subjecting the overflowing molten glasses to down-draw downward while the molten glasses are joined at the lower end of the forming trough, to thereby manufacture a glass sheet. In the overflow down-draw method, surfaces that are to serve as the surfaces of the glass sheet are formed in a state of free surfaces without being brought into contact with the surface of the forming trough. Accordingly, a glass sheet having satisfactory surface quality in an unpolished state can be manufactured at low cost.

The tempered glass sheet of the present invention is preferably used for a touch panel display.

The tempered glass sheet of the present invention is preferably used for a cover glass for a cellular phone.

The tempered glass sheet of the present invention is preferably used for a cover glass for a solar battery.

A tempered glass sheet of the present invention is a tempered glass sheet having a length dimension of 500 mm or more, a width dimension of 300 mm or more, and a thickness of from 0.1 to 2.0 mm, characterized in that: the tempered glass sheet comprises as a glass composition, in terms of mol %, 50 to 77% of $SiO_2$, 6.5 to 12.4% of $Al_2O_3$, 1 to 10% of $B_2O_3$, 0 to 1% of $Li_2O$, 9 to 15.5% of $Na_2O$, 0 to 3.5% of $K_2O$, 9 to 16.5% of $Li_2O+Na_2O+K_2O$, 0.1 to 2.5% of MgO, 0.1 to 2.5% of MgO+CaO+SrO+BaO, and 13 to 1.5% of $Li_2O+Na_2O+K_2O+MgO+CaO+SrO+BaO$, has a molar ratio $MgO/(Li_2O+Na_2O+K_2O+MgO+CaO+SrO+BaO)$ of from 0.01 to 0.2 and a molar ratio $(Al_2O_3+B_2O_3)/SiO_2$ of from 0.15 to 0.30, and is substantially free of $As_2O_3$, $Sb_2O_3$, PbO, and F; and the tempered glass sheet has a density of 2.45 g/cm$^3$ or less, a compression stress value of a compression stress layer of 300 MPa or more, a thickness of the compression stress layer of 10 μm or more, a liquidus temperature of 1,200° C. or less, and a thermal expansion coefficient in a temperature range of from 30 to 380° C. of 90×10$^{-7}$ or less.

A tempered glass container of the present invention comprises the tempered glass. Further, the tempered glass container of the present invention is preferably used for a container for pharmaceuticals.

As a container to be filled for storing a pharmaceutical, there has been used a glass container in the form of an ampule, a vial, a prefilled syringe, a cartridge, or the like. In recent years, along with progress in pharmacy and medicine, the number of cases where the glass container is filled with an expensive drug has been increasing. However, the glass container may break in a manufacturing process at a pharmaceutical company, or at a clinical site. When the glass container filled with an expensive drug breaks, not only the loss of the drug itself, but also a production loss involved in the interruption of a manufacturing line occurs, resulting in an extremely significant total loss in cost. Further, the breakage of the glass container also generates a safety risk.

A flaw present in the glass container is a cause for the breakage of the glass container. The flaw is generated in each of various steps such as container processing, inspection, transportation, and drug filling. Therefore, the glass container to be used for a pharmaceutical is required to have flaw resistance, and because of the nature of its application, is also required to have acid resistance and be free of an environmental load substance. Accordingly, the tempered glass (tempered glass container) of the present invention, which is excellent in flaw resistance and acid resistance, and is substantially free of $As_2O_3$, $Sb_2O_3$, PbO, and F, is suitable for this application.

A glass to be tempered of the present invention preferably comprises as a glass composition, in terms of mol %, 50 to 80% of $SiO_2$, 5 to 30% of $Al_2O_3$, 0 to 2% of $Li_2O$, 5 to 25% of $Na_2O$, and 0 to 5% of $K_2O$, and is preferably substantially free of $As_2O_3$, $Sb_2O_3$, PbO, and F.

When the tempered glass of the present invention is immersed in a 10 mass % aqueous hydrochloric acid solution at 80° C. for 24 hours, it is preferred that a mass reduction be 40 mg/cm$^2$ or less.

The glass to be tempered of the present invention preferably has a ratio $CS_2/CS_1$ of a compression stress value $CS_2$ to a compression stress value $CS_1$ of 0.7 or more, the compression stress value $CS_1$ being determined for a compression stress layer that is obtained by subjecting the glass to be tempered to ion exchange treatment in a potassium nitrate molten salt free of a history of being used, the compression stress value $CS_2$ being determined for a compression stress layer that is obtained by subjecting the glass to be tempered to ion exchange treatment in a potassium nitrate molten salt comprising 20,000 ppm (by mass) of Na ions. It should be noted that in the calculation of the $CS_2/CS_1$, an ion exchange temperature is set to 430° C. and an ion exchange time is set to 4 hours.

DESCRIPTION OF EMBODIMENTS

Figure 1A:
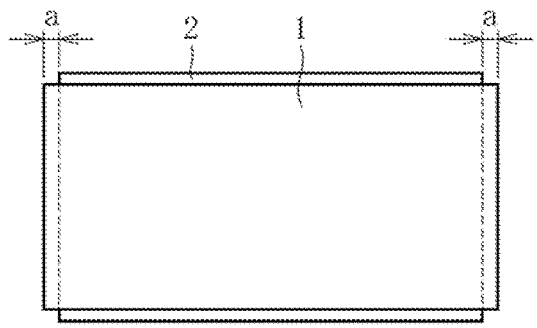
FIG. 1a is a schematic plan view illustrating a first example of the attachment state of a protective resin film with respect to a glass sheet to be tempered according to an embodiment of the present invention.

A tempered glass of the present invention has a compression stress layer in a surface thereof. A method of forming the compression stress layer in the surface includes a physical tempering method and a chemical tempering method. The tempered glass of the present invention is preferably produced by the chemical tempering method.

The chemical tempering method is a method involving introducing alkali ions each having a large ion radius into the surface of glass by ion exchange treatment at a temperature equal to or lower than a strain point of the glass. When the chemical tempering method is used to form a compression stress layer, the compression stress layer can be properly formed even in the case where the thickness of the glass is small. In addition, even when a tempered glass is cut after the formation of the compression stress layer, the tempered glass does not easily break unlike a tempered glass produced by applying a physical tempering method such as an air cooling tempering method.

Described below are reasons why the content ranges of the respective components in the tempered glass of the present invention are restricted as described above. It should be noted that in the description of the content range of each component, the expression "%" means "mol." unless otherwise specified.

$SiO_2$ is a component that forms a network of glass, and the content of $SiO_2$ is from 50 to 80%, and is preferably from 55 to 77%, from 57 to 75%, from 58 to 74%, from 60 to 73%, or from 62 to 72%. When the content of $SiO_2$ is too small in glass, vitrification does not occur easily, the acid resistance of the glass reduces, the thermal expansion coefficient becomes too high, and the thermal shock resistance easily lowers. On the other hand, when the content of $SiO_2$ is too large in glass, the meltability and formability easily lower, and the thermal expansion coefficient becomes too low, with the result that it becomes difficult to match the thermal expansion coefficient with those of peripheral materials. It should be noted that when the content of $SiO_2$ is decreased and the content of $B_2O_3$ is increased, density and viscosity at high temperature can both be easily lowered, but at the same time, the acid resistance lowers, and hence it is difficult to apply the tempered glass to an acid treatment step at the time of the formation of a touch panel sensor.

$Al_2O_3$ is a component that enhances the ion exchange performance of glass and a component that enhances the strain point or Young's modulus, and the content of $Al_2O_3$ is from 5 to 30%. When the content of $Al_2O_3$ is too small in glass, the ion exchange performance may not be exhibited sufficiently. Thus, a suitable lower limit range of the content of $Al_2O_3$ is 5.5% or more, 6% or more, 6.5% or more, 7% or more, 8% or more, or 9% or more. On the other hand, when the content of $Al_2O_3$ is too large in glass, the density of the glass easily increases and devitrified crystals are easily deposited in the glass, and it becomes difficult to form a glass sheet by an overflow down-draw method or the like. Further, the thermal expansion coefficient of the glass becomes too low, and it becomes difficult to match the thermal expansion coefficient with those of peripheral materials. In addition, the acid resistance also lowers, which makes it difficult to apply the tempered glass to an acid treatment step at the time of the formation of a touch panel sensor. Further, viscosity at high temperature increases, which is liable to lower meltability. Thus, a suitable upper limit range of the content of $Al_2O_3$ is 25% or less, 20% or less, 18% or less, 16% or less, 15% or less, 14% or less, 13.5% or less, 13.4% or less, 13% or less, 12.5% or less, or 12.4% or less.

$Li_2O$ is an ion exchange component and is a component that lowers the viscosity at high temperature of glass to increase the meltability and the formability, and increases the Young's modulus. However, $Li_2O$ is a component that deteriorates an ion exchange solution. Further, $Li_2O$ has a great effect of increasing the compression stress value of glass among alkali metal oxides, but when the content of $Li_2O$ becomes extremely large in a glass system containing $Na_2O$ at 7% or more, the compression stress value tends to lower contrarily. Further, when the content of $Li_2O$ is too large in glass, the liquidus viscosity lowers, easily resulting in the devitrification of the glass, and the thermal expansion coefficient becomes too high, with the result that the thermal shock resistance lowers and it becomes difficult to match the thermal expansion coefficient with those of peripheral materials. In addition, the viscosity at low temperature of the glass becomes too low, and the stress relaxation occurs easily, with the result that the compression stress value lowers contrarily in some cases. Thus, the content of $Li_2O$ is 2% or less, and is preferably 1.7% or less, 1.5% or less, 1% or less, less than 1%, 0.5% or less, 0.3% or less, 0.2% or less, or 0.1% or less.

$Na_2O$ is an ion exchange component and is a component that lowers the viscosity at high temperature of glass to increase the meltability and formability. $Na_2O$ is also a component that improves the devitrification resistance of glass. When the content of $Na_2O$ is too small in glass, the meltability lowers, the thermal expansion coefficient unreasonably lowers, and the ion exchange performance is liable to lower. Thus, the content of $Na_2O$ is 5% or more, and a suitable lower limit range thereof is 7% or more, more than 7.0%, 8% or more, or 9% or more. On the other hand, when the content of $Na_2O$ is too large in glass, there is a tendency that the density increases and the thermal expansion coefficient becomes too high, with the result that the thermal shock resistance lowers, it becomes difficult to match the thermal expansion coefficient with those of peripheral materials, and the density increases. Further, the strain point lowers excessively, and the glass composition loses its component balance, with the result that the devitrification resistance lowers contrarily in some cases. Further, the ion exchange solution is liable to deteriorate. Thus, the content of $Na_2O$ is 25% or less, and a suitable upper limit range thereof is 23% or less, 21% or less, 19% or less, 18.5% or less, 17% or less, 16% or less, 15.5% or less, 14% or less, 13.5% or less, or 13% or less.

$K_2O$ is a component that promotes ion exchange and is a component that allows the thickness of a compression stress layer to be easily enlarged among alkali metal oxides. $K_2O$ is also a component that lowers the viscosity at high temperature of glass to increase the meltability and formability. $K_2O$ is also a component that improves devitrification resistance. However, when the content of $K_2O$ is too large, the density of glass increases, the thermal expansion coefficient of the glass becomes too large, the thermal shock resistance of the glass lowers, and it becomes difficult to match the thermal expansion coefficient with those of peripheral materials. Further, the strain point lowers excessively, and the glass composition loses its component balance, with the result that the devitrification resistance tends to lower contrarily. Thus, a suitable upper limit range of the content of $K_2O$ is 5% or less, 4% or less, 3.5% or less, or 3% or less. It should be noted that when $K_2O$ is added, a suitable addition amount is 0.1% or more, 0.5% or more, or 1% or more. In addition, when the addition of KO is avoided as much as possible, the suitable addition amount is 1.9% or less, 1.35% or less, 1% or less, or less than 1%, particularly preferably 0.05% or less.

When the content of $Li_2O+Na_2O+K_2O$ is excessively low, the ion exchange performance and the meltability are liable to lower. Thus, a suitable lower limit range of the content of $Li_2O+Na_2O+K_2O$ is 5% or more, 9% or more, 10% or more, 11% or more, 12% or more, 131 or more, or 14% or more. On the other hand, when the content of $Li_2O+Na_2O+K_2O$ is excessively high, there is a tendency that the thermal expansion coefficient increases excessively, with the result that the thermal shock resistance lowers, it becomes difficult to match the thermal expansion coefficient with those of peripheral materials, and the density increases. There is also a tendency that the strain point lowers excessively and the component balance of the glass composition is lost, with the result that the devitrification resistance lowers contrarily. Thus, a suitable upper limit range of the content of $Li_2O+Na_2O+K_2O$ is 30% or less, 19% or less, 18.5 or less, 18% or less, 17.5% or less, 17% or less, or 16.5% or less.

For example, the following components other than the components may be added.

The content of $B_2O_3$ is preferably from 0 to 15%. $B_2O_3$ is a component that lowers the viscosity at high temperature and density of glass, stabilizes the glass so that a crystal may be unlikely precipitated, and lowers the liquidus temperature of the glass. In addition, $B_2O_3$ is a component that enhances crack resistance to enhance flaw resistance. Thus, a suitable lower limit range of the content of $B_2O_3$ is 0.01% or more, 0.1% or more, 0.5% or more, 1% or more, 2% or more, 3% or more, 4% or more, 5'% or more, 5.5% or more, or 6% or more. However, when the content of $B_2O_3$ is too large, the acid resistance of glass may reduce, coloring on the surface of the glass called weathering may occur through ion exchange, water resistance may lower, and the thickness of a compression stress layer is liable to decrease. Thus, a suitable upper limit range of the content of $B_2O_3$ is 14% or less, 13% or less, 12% or less, 11% or less, less than 10.5%, 10% or less, 9% or less, or 8% or less.

MgO is a component that reduces the viscosity at high temperature of glass to enhance the meltability and formability, and increases the strain point and Young's modulus, and is a component that has a great effect of enhancing the ion exchange performance among alkaline earth metal oxides. Thus, a suitable lower limit range of the content of MgO is 0.01% or more, 0.05% or more, or 0.1% or more, particularly preferably 0.5% or more. However, when the content of MgO is too large in glass, the density and thermal expansion coefficient easily increase, and the devitrification of the glass tends to occur easily. Thus, a suitable upper limit range of the content of MgO is 3% or less, 2.7% or less, 2.5% or less, 2.2% or less, 2% or less, 1.5% or less, or 1% or less.

CaO has greater effects of reducing the viscosity at high temperature of glass to enhance the meltability and formability, and increasing the strain point and Young's modulus without involving a reduction in devitrification resistance as compared to other components. However, when the content of CaO is too large in glass, the density and thermal expansion coefficient increase, and the glass composition loses its component balance, with the result that the glass is liable to devitrify contrarily, the ion exchange performance lowers, and the deterioration of an ion exchange solution occurs easily. Thus, the content of CaO is preferably from 0 to 6%, from 0 to 5%, from 0 to 4%, from 0 to 3.5, from 0 to 3%, from 0 to 2%, or from 0 to 1.

SrO is a component that reduces the viscosity at high temperature of glass to enhance the meltability and formability, and increases the strain point and Young's modulus. However, when the content thereof is too large in glass, an ion exchange reaction is liable to be inhibited, and moreover, the density and thermal expansion coefficient increase, and the devitrification of the glass occurs easily. Thus, the content of SrO is preferably from 0 to 1.5%, from 0 to 1%, from 0 to 0.5%, from 0 to 0.1%, or from 0 to less than 0.1%.

BaO is a component that reduces the viscosity at high temperature of glass to enhance the meltability and formability, and increases the strain point and Young's modulus. However, when the content of BaO is too large in glass, an ion exchange reaction is liable to be inhibited, and moreover, the density and thermal expansion coefficient increase, and the devitrification of the glass occurs easily. Thus, the content of BaO is preferably from 0 to 6%, from 0 to 3%, from 0 to 1.5%, from 0 to 1%, from 0 to 0.5%, from 0 to 0.1%, or from 0 to less than 0.1%.

When the content of MgO+CaO+SrO+BaO is excessively high, there is a tendency that the density and the thermal expansion coefficient increase, the glass devitrifies, and the ion exchange performance lowers. Thus, a suitable upper limit range of the content of MgO+CaO+SrO+BaO is 9.9% or less, 6.5% or less, 5% or less, 3% or less, 2.8% or less, 2.7% or less, 2.5% or less, 2.2% or less, 2% or less, 1.5% or less, or 1% or less. On the other hand, when the content of MgO+CaO+SrO+BaO is excessively low, the meltability and the formability are liable to lower, and the strain point and the Young's modulus are liable to lower. Thus, a suitable lower limit range of the content of MgO+CaO+SrO+BaO is 0.01% or more, 0.05% or more, 0.1% or more, or 0.5% or more.

When the content of $Li_2O+Na_2O+K_2O+MgO+CaO+SrO+BaO$ is excessively low, the meltability is liable to lower. Thus, a suitable lower limit range of the content of $Li_2O+Na_2O+K_2O+MgO+CaO+SrO+BaO$ is 10% or more, 12% or more, 13% or more, or 14% or more. On the other hand, when the content of $Li_2O+Na_2O+K_2O+MgO+CaO+SrO+BaO$ is excessively high, there is a tendency that the density and the thermal expansion coefficient increase, and the ion exchange performance lowers. Thus, a suitable upper limit range of the content of $Li_2O+Na_2O+K_2O+MgO+CaO+SrO+BaO$ is 30% or less, 25% or less, 23% or less, 21% or less, 20% or less, 19% or less, 18.5% or less, or 18% or less.

When a molar ratio $MgO/(Li_2O+Na_2O+K_2O+MgO+CaO+SrO+BaO)$ reduces, the ion exchange performance tends to lower, and the thermal expansion coefficient is liable to increase. Thus, a suitable lower limit range of the molar ratio $MgO/(Li_2O+Na_2O+K_2O+MgO+CaO+SrO+BaO)$ is 0.001 or more, 0.005 or more, 0.01 or more, 0.02 or more, 0.03 or more, 0.04 or more, or 0.05 or more. On the other hand, when the molar ratio $MgO/(Li_2O+Na_2O+K_2O+MgO+CaO+SrO+BaO)$ increases, the devitrification resistance is liable to lower, and the glass is liable to undergo phase separation. Thus, a suitable upper limit range of the molar ratio $MgO/(Li_2O+Na_2O+K?O+MgO+CaO+SrO+BaO)$ is 0.5 or less, 0.3 or less, 0.25 or less, 0.2 or less, 0.15 or less, 0.1 or less, 0.09 or less, 0.08 or less, or 0.07 or less.

When a molar ratio $(Al_2O_3+B_2O_3)/SiO_2$ reduces, the crack resistance is liable to lower, and the meltability and the formability are liable to lower. Thus, a suitable lower limit range of the molar ratio $(Al_2O_3+B_2O_3)/SiO_2$ is 0.1 or more, 0.15 or more, 0.16 or more, 0.17 or more, 0.18 or more, 0.19 or more, or 0.2 or more. On the other hand, when the molar ratio $(Al_2O_3+B_2O_3)/SiO_2$ increases, the devitrification resistance is liable to lower, the glass is liable to undergo phase separation, and the acid resistance is liable to lower. Thus, a suitable upper limit range of the molar ratio $(Al_2O_3+B_2O_3)/SiO_2$ is 0.5 or less, 0.4 or less, 0.35 or less, 0.32 or less, 0.31 or less, 0.30 or less, 0.29 or less, 0.28 or less, 0.27 or less, or 0.26 or less.

A molar ratio $B_2O_3/Al_2O_3$ is preferably from 0 to 1, from 0.1 to 0.6, from 0.12 to 0.5, from 0.142 to 0.37, from 0.15 to 0.35, from 0.18 to 0.32, or from 0.2 to 0.3. This allows both the devitrification resistance and the ion exchange performance to be achieved at high levels while the viscosity at high temperature is optimized.

A molar ratio $B_2O_3/(Na_2O+Al_2O_3)$ is preferably from 0 to 1, from 0.01 to 0.5, from 0.02 to 0.4, from 0.03 to 0.3, from 0.03 to 0.2, from 0.04 to 0.18, from 0.05 to 0.17, from 0.06 to 0.16, or from 0.07 to 0.15. This allows both the devitrification resistance and the ion exchange performance to be achieved at high levels while the viscosity at high temperature is optimized.

$TiO_2$ is a component that enhances the ion exchange performance of glass and is a component that reduces the viscosity at high temperature. However, when the content of $TiO_2$ is too large in glass, the glass is liable to be colored and to devitrify. Thus, the content of $TiO_2$ is preferably from 0 to 4.5%, from 0 to 1%, from 0 to 0.5%, from 0 to 0.3%, from 0 to 0.1%, from 0 to 0.05%, or from 0 to 0.01%.

$ZrO_2$ is a component that enhances the ion exchange performance of glass, and is a component that increases the viscosity of glass around the liquidus viscosity and the strain point. Thus, a suitable lower limit range of the content of $ZrO_2$ is 0.001% or more, 0.005% or more, 0.01% or more, or 0.05% or more. However, when the content of $ZrO_2$ is excessively high, there is a risk that the devitrification resistance may lower markedly and the crack resistance may lower, and there is also a risk that the density may increase excessively. Thus, a suitable upper limit range of the content of $ZrO_2$ is 5% or less, 4% or less, 3% or less, 2% or less, 1% or less, 0.5% or less, 0.3% or less, or 0.1% or less.

ZnO is a component that enhances the ion exchange performance of glass and is a component that has a great effect of increasing the compression stress value, in particular. Further, ZnO is a component that reduces the viscosity at high temperature of glass without reducing the viscosity at low temperature. However, when the content of ZnO is too large in glass, there is a tendency that the glass undergoes phase separation, the devitrification resistance lowers, the density increases, and the thickness of the compression stress layer in the glass decreases. Thus, the content of ZnO is preferably from 0 to 6%, from 0 to 5%, from 0 to 3%, or from 0 to 1%.

$P_2O_5$ is a component that enhances the ion exchange performance of glass and is a component that increases the thickness of the compression stress layer, in particular. However, when the content of $P_2O_5$ is too large in glass, the glass undergoes phase separation, and the water resistance is liable to lower. Thus, the content of $P_2O_5$ is preferably from 0 to 10%, from 0 to 3%, from 0 to 1%, from 0 to 0.5%, or from 0 to 0.1%.

$SnO_2$ has an effect of enhancing ion exchange performance. Thus, the content of $SnO_2$ is preferably from 0 to 3%, from 0.01 to 3%, from 0.05 to 3%, from 0.1 to 3%, or from 0.2 to 3%.

As a fining agent, one kind or two or more kinds selected from the group consisting of Cl, $SO_3$, and $CeO_2$ (preferably the group consisting of Cl and $SO_3$) may be added at 0 to 3%.

The content of $SnO_2+SO_3+Cl$ is preferably from 0.01 to 3%, from 0.05 to 3%, from 0.1 to 3%, or from 0.2 to 3% from the viewpoint of simultaneously achieving a fining effect and an effect of enhancing ion exchange performance. It should be noted that the term "$SnO_2+SO_3+Cl$" refers to the total amount of $SnO_2$, Cl, and $SO_3$.

The content of $Fe_2O_3$ is preferably less than 1,000 ppm (less than 0.1%), less than 800 ppm, less than 600 ppm, less than 400 ppm, or less than 300 ppm. Further, the molar ratio $Fe_2O_3/(Fe_2O_3+SnO_2)$ is controlled to preferably 0.8 or more, 0.9 or more, or 0.95 or more, while the content of $Fe_2O_3$ is controlled in the above-mentioned range. As a result, the transmittance (400 nm to 770 nm) of glass having a thickness of 1 mm is likely to improve (by, for example, 90% or more).

A rare earth oxide such as $Nb_2O_5$ or $La_2O_3$ is a component that enhances the Young's modulus. However, the cost of the raw material itself is high, and when the rare earth oxide is added in a large amount, the devitrification resistance is liable to deteriorate. Thus, the content of the rare earth oxide is preferably 3% or less, 2% or less, 1% or less, 0.5% or less, or 0.1% or less.

The tempered glass of the present invention is substantially free of $As_2O_3$, $Sb_2O_3$, PbO, and F as a glass composition from the standpoint of environmental considerations. In addition, the tempered glass is preferably substantially free of $Bi_2O_3$ from the standpoint of environmental considerations. The gist of the phrase "substantially free of $Bi_2O_3$" resides in that $Bi_2O_3$ is not added positively as a glass component, but contamination with $Bi_2O_3$ as an impurity is allowable. Specifically, the phrase means that the content of $Bi_2O_3$ is less than 0.05%.

In the tempered glass of the present invention, the suitable content range of each component can be appropriately selected to attain a suitable glass composition range. Of those, particularly suitable glass composition ranges are as described below.

(1) A glass composition comprising, in terms of mol %, 50 to 80% of $SiO_2$, 5 to 30% of $Al_2O_3$, 0 to 2% of $Li_2O$, 5 to 25% of $Na_2O$, and 0 to 5% of $K_2O$, and being substantially free of $As_2O_3$, $Sb_2O_3$, PbO, and F.

(2) A glass composition comprising, in terms of mol %, 50 to 80% of $SiO_2$, 6.5 to 12.4% of $Al_2O_3$, 0 to 1.7% of $Li_2O$, more than 7.0 to 15.5% of $Na_2O$, 0 to 3.5% of $K_2O$, and 0 to 2.5% of MgO, and being substantially free of $As_2O_3$, $Sb_2O_3$, PbO, and F.

(3) A glass composition comprising, in terms of mol %, 50 to 80% of $SiO_2$, 6.5 to 12.4% of $Al_2O_3$, 0 to 1% of $Li_2O$, 9 to 15.5% of $Na_2O$, 0 to 3.5% of $K_2O$, 0.1 to 2.5% of MgO, and 0 to 2.5% of MgO+CaO+SrO+BaO, and being substantially free of $As_2O_3$, $Sb_2O_3$, PbO, and F.

(4) A glass composition comprising, in terms of mol, 50 to 80% of $SiO_2$, 6.5 to 12.4% of $Al_2O_3$, 0.01 to 15% of $B_2O_3$, 0 to 1% of $Li_2O$, 9 to 15.5% of $Na_2O$, 0 to 3.5% of $K_2O$, 9 to 16.5% of $Li_2O+Na_2O+K_2O$, 0.1 to 2.5% of MgO, and 0.1 to 2.5% of MgO+CaO+SrO+BaO, and being substantially free of $As_2O_3$, $Sb_2O_3$, PbO, and F.

(5) A glass composition comprising, in terms of mol %, 50 to 77% of $SiO_2$, 6.5 to 12.4% of $Al_2O_3$, 1 to 15% of $B_2O_3$, 0 to 1% of $Li_2O$, 9 to 15.5% of $Na_2O$, 0 to 3.5% of $K_2O$, 9 to 16.5% of $Li_2O+Na_2O+K_2O$, 0.1 to 2.5% of MgO, 0.1 to 2.5% of MgO+CaO+SrO+BaO, and 13 to 13.5% of $Li_2O+Na_2O+K_2O+MgO+CaO+SrO+BaO$, and being substantially free of $As_2O_2$, $Sb_2O_3$, PbO, and F.

(6) A glass composition comprising, in terms of mol %, 50 to 77% of $SiO_2$, 6.5 to 12.4% of $Al_2O_3$, 1 to 10% of $B_2O_3$, 0 to 1% of $Li_2O$, 9 to 15.5% of $Na_2O$, 0 to 3.5% of $K_2O$, 9 to 16.5% of $Li_2O+Na_2O+K_2O$, 0.1 to 2.5% of MgO, 0.1 to 2.5% of MgO+CaO+SrO+BaO, and 13 to 18.5% of $Li_2O+Na_2O+K_2O+MgO+CaO+SrO+BaO$, having a molar ratio $MgO/(Li_2O+Na_2O+K_2O+MgO+CaO+SrO+BaO)$ of from 0.01 to 0.2, and being substantially free of $As_2O_3$, $Sb_2O_3$, PbO, and F.

(7) A glass composition comprising, in terms of mol %, 50 to 77% of $SiO_2$, 6.5 to 12.4% of $Al_2O_3$, 1 to 10% of $B_2O$, 0 to 1% of $Li_2O$, 9 to 15.5% of $Na_2O$, 0 to 3.5% of $K_2O$, 9 to 16.5% of $Li_2O+Na_2O+K_2O$, 0.1 to 2.5% of MgO, 0.1 to 2.5% of MgO+CaO+SrO+BaO, and 13 to 18.5% of $Li_2O+Na_2O+K_2O+MgO+CaO+SrO+BaO$, having a molar ratio $MgO/(Li_2O+Na_2O+K_2O+MgO+CaO+SrO+BaO)$ of from 0.01 to 0.2 and a molar ratio $(Al_2O_3+B_2O_3)/SiO_2$ of from 0.15 to 0.30, and being substantially free of $As_2O_3$, $Sb_2O_3$, PbO, and F.

The tempered glass of the present invention preferably has the following properties, for example.

The tempered glass of the present invention has a compression stress layer in the surface thereof. The compression stress value of the compression stress layer is preferably 300 MPa or more, 400 MPa or more, from 500 MPa to 1,500 MPa, or 500 MPa or more and less than 900 MPa. As the compression stress value becomes larger, the mechanical strength of the tempered glass becomes higher. It should be noted that there is a tendency that the compression stress value is increased by increasing the content of $Al_2O_3$, MgO, ZnO, $TiO_2$, or $ZrO_2$ in the glass composition or by decreasing the content of SrO or BaO in the glass composition. Further, there is a tendency that the compression stress value is increased by shortening a time necessary for ion exchange or by decreasing the temperature of an ion exchange solution. It should be noted that when the compression stress value of the compression stress layer is excessively large, its internal tensile stress becomes excessively high, with the result that the tempered glass is liable to undergo spontaneous breakage.

The thickness of the compression stress layer is preferably 10 µm or more, 15 µm or more, 15 µm or more and less than 80 µm, or 15 µm or more and 60 µm or less. As the thickness of the compression stress layer becomes larger, the tempered glass is more hardly cracked even when the tempered glass has a deep flaw, and a variation in the mechanical strength of the tempered glass becomes smaller. It should be noted that there is a tendency that the thickness of the compression stress layer is increased by increasing the content of $K_2O$ or $P_2O_5$ in the glass composition or decreasing the content of SrO or BaO in the glass composition. In addition, there is a tendency that the thickness of the compression stress layer is increased by lengthening an ion exchange time or by increasing the temperature of an ion exchange solution. It should be noted that when the thickness of the compression stress layer is excessively large, its internal tensile stress becomes excessively high, with the result that the tempered glass is liable to undergo spontaneous breakage.

The tempered glass of the present invention has a density of preferably 2.6 g/cm³ or less, 2.55 g/cm³ or less, 2.50 g/cm³ ox less, 2.48 g/cm³ or less, 2.45 g/cm³ or less, 2.43 g/cm³ or less, 2.42 g/cm³ or less, 2.41 g/cm³ or less, or 2.40 g/cm³ or less. As the density becomes smaller, the weight of the tempered glass can be reduced more. It should be noted that the density is easily reduced by increasing the content of $SiO_2$, $B_2O_3$, or $P_2O_5$ in the glass composition or by decreasing the content of an alkali metal oxide, alkaline earth metal oxide, ZnO, $ZrO_2$, or $TiO_2$ in the glass composition.

The tempered glass of the present invention has a thermal expansion coefficient in a temperature range of from 30 to 380° C. of preferably $100 \times 10^{-7}$/° C. or less, $95 \times 10^{-7}$/° C. or less, $93 \times 10^{-7}$/° C. or less, $90 \times 10^{-7}$/° C. or less, $88 \times 10^{-7}$/° C. or less, $85 \times 10^{-7}$/° C. or less, $83 \times 10^{-7}$/° C. or less, $82 \times 10^{-7}$/° C. or less, $80 \times 10^{-7}$/C or less, $79 \times 10^{-7}$/° C. or less, $78 \times 10^{-7}$/° C. or less, or from $50 \times 10^{-7}$ to $77 \times 10^{-7}$/° C. When the thermal expansion coefficient is regulated within the above-mentioned range, the thermal, shock resistance improves, and hence the time required for preheating before tempering treatment or annealing after the tempering treatment can be shortened. As a result, the productivity of the tempered glass can be enhanced. In addition, the thermal expansion coefficient can be easily matched with that of a member such as a metal or an organic adhesive, which makes it easy to prevent the detachment of the member such as the metal or the organic adhesive. In particular, when the thermal expansion coefficient is regulated within the above-mentioned range, in the case of using the tempered glass for a tempered glass container, its breakage due to a thermal shock in a heat treatment process in, for example, a glass tube-manufacturing step, processing step, or sterilizing step can be easily prevented. It should be noted that an increase in the content of an alkali metal oxide or alkaline earth metal oxide in the glass composition is likely to increase the thermal expansion coefficient, and conversely, a reduction in the content of the alkali metal oxide or alkaline earth metal oxide is likely to lower the thermal expansion coefficient.

The tempered glass of the present invention has a temperature at $10^{4.0}$ dPa·s of preferably 1,300° C. or less, 1,280° C. or less, 1,250° C. or less, 1,220° C. or less, or 1,200° C. or less. As the temperature at $10^{4.0}$ dPa·s becomes lower, a burden on a forming facility is reduced more, the forming facility has a longer life, and consequently, the manufacturing cost of the tempered glass is more likely to be reduced. It should be noted that the temperature at $10^{4.0}$ dPa·s is easily decreased by increasing the content of an alkali metal oxide, an alkaline earth metal oxide, ZnO, $B_2O_3$, or $TiO_2$ or by reducing the content of $SiO_2$ or $Al_2O_3$.

The tempered glass of the present invention has a temperature at $10^{2.5}$ dPa·s of preferably 1,650° C. or less, 1,600° C. or less, 1,580° C. or less, or 1,550° C. or less. As the temperature at $10^{2.5}$ dPa·s becomes lower, melting at lower temperature can be carried out, and hence a burden on glass manufacturing equipment such as a melting furnace is reduced more, and the bubble quality of glass is improved more easily. That is, as the temperature at $10^{2.5}$ dPa·s becomes lower, the manufacturing cost of the tempered glass is more likely to be reduced. Herein, the "temperature at $10^{2.5}$ dPa·s" can be measured by, for example, a platinum sphere pull up method. It should be noted that the temperature at $10^{2.5}$ dPa·s corresponds to a melting temperature. In addition, an increase in the content of an alkali metal oxide, alkaline earth metal oxide, $B_2O_3$, ZnO, or $TiO_2$ in the glass composition or a reduction in the content of $SiO_2$ or $Al_2O_3$ in the glass composition is likely to lower the temperature at $10^{2.5}$ dPa·s.

The tempered glass of the present invention has a liquidus temperature of preferably 1,200° C. or less, 1,150° C. or less, 1,100° C. or less, 1,080° C. or less, 1,050° C. or less, 1,020° C. or less, or 1,000° C. or less. It should be noted that as the liquidus temperature becomes lower, the devitrification resistance and formability are improved more. It should be noted that the liquidus temperature is easily decreased by increasing the content of $Na_2O$, $K_2O$, or $B_2O_3$ in the glass composition or by reducing the content of $Al_2O_3$, $Li_2O$, MgO, ZnO, $TiO_2$, or $ZrO_2$ in the glass composition.

The tempered glass of the present invention has a liquidus viscosity of preferably $10^{4.0}$ dPa·s or more, $10^{4.4}$ dPa·s or more, $10^{4.8}$ dPa·s or more, $10^{5.0}$ dPa·s or more, $10^{5.3}$ dPa·s or more, $10^{5.5}$ dPa·s or more, $10^{5.7}$ dPa·s or more, $10^{5.6}$ dPa·s or more, or $10^{6.0}$ dPa·s or more. It should be noted that as the liquidus viscosity becomes higher, the devitrification resistance and formability are improved more. Further, the liquidus viscosity is easily increased by increasing the content of $Na_2O$ or $K_2O$ in the glass composition or by reducing the content of $Al_2O_3$, $Li_2O$, MgO, ZnO, $TiO_2$, or $ZrO_2$ in the glass composition.

The tempered glass of the present invention has a crack resistance before tempering treatment of preferably 100 gf or more, 200 gf or more, 300 gf or more, 400 gf or more, 500 gf or more, 600 gf or more, 700 gf or more, 800 gf or more, 900 gf or more, or 1,000 gf or more. As the crack resistance increases, a surface flaw is less liable to be created on the tempered glass, and hence the mechanical strength of the tempered glass is less liable to lower. In addition, the mechanical strength is less liable to vary. In addition, when the crack resistance is high, a lateral crack is hardly generated at the time of post-tempering cutting such as scribe cutting, and hence the post-tempering scribe cutting can be easily performed appropriately. As a result, the manufacturing cost of a device can be easily reduced.

Herein, the "crack resistance" refers to a load at a crack generation rate of 50%. In addition, the "crack generation rate" refers to a value measured as described below. First, in a constant temperature and humidity chamber kept at a humidity of 30% and a temperature of 25° C., a Vickers indenter set to a predetermined load is driven into a glass surface (optically polished surface) for 1.5 seconds, and 15 seconds after that, the number of cracks generated from the four corners of the indentation is counted (4 per indentation at maximum). The indenter is driven in this manner 20 times, the total number of generated cracks is determined, and then the crack generation rate is determined by the following expression: total number of generated cracks/80× 100.

When the tempered glass of the present invention is immersed in a 10 mass % aqueous hydrochloric acid solution at 80° C. for 24 hours, its mass reduction is preferably 150 mg/cm$^2$ or less, 100 mg/cm$^2$ or less, 50 mg/cm$^2$ or less, 45 mg/cm$^2$ or less, 40 mg/cm$^2$ or less, 30 mg/cm$^2$ or less, 20 mg/cm$^2$ or less, 10 mg/cm$^2$ or less, 5 mg/cm$^2$ or less, 3 mg/cm$^2$ or less, 1 mg/cm$^2$ or less, 0.8 mg/cm$^2$ or less, 0.7 mg/cm$^2$ or less, 0.6 mg/cm$^2$ or less, 0.5 mg/cm$^2$ or less, 0.4 mg/cm$^2$ or less, 0.3 mg/cm$^2$ or less, 0.2 mg/cm$^2$ or less, or 0.1 mg/cm$^2$ or less. As the mass reduction reduces, the tempered glass becomes less liable to be corroded by a chemical. Thus, the tempered glass can be appropriately treated in a photoresist step or the like.

A tempered glass sheet of the present invention comprises the tempered glass described above. Thus, technical features (suitable characteristics, suitable component ranges, and the like) of the tempered glass sheet of the present invention are the same as the technical features of the tempered glass of the present invention in principle, and hence detailed descriptions of the technical features of the tempered glass sheet of the present invention are omitted here.

The surface of the tempered glass sheet of the present invention has an average surface roughness (Ra) of preferably 10 Å or less, 8 Å or less, 6 Å or less, 4 Å or less, 3 Å or less, particularly 2 Å or less. As the average surface roughness (Ra) increases, the mechanical strength of the tempered glass sheet tends to become lower. Herein, the average surface roughness (Ra) refers to a value measured by a method in conformity with SEMI D7-97 "FPD Glass Substrate Surface Roughness Measurement Method."

The tempered glass sheet of the present invention has a length dimension of preferably 500 mm or more, 700 mm or more, or 1,000 mm or more and a width dimension of preferably 500 mm or more, 700 mm or more, or 1,000 mm or more. An increase in the size of the tempered glass sheet enables the tempered glass sheet to be suitably used as a cover glass for the display portion of the display of a large-size TV or the like.

The sheet thickness of the tempered glass sheet of the present invention is preferably 2.0 mm or less, 1.5 mm or less, 1.3 mm or less, 1.1 mm or less, 1.0 mm or less, 0.8 mm or less, or 0.7 mm or less. Meanwhile, when the sheet thickness is excessively small, desired mechanical strength is difficult to obtain. Thus, the sheet thickness is preferably 0.1 mm or more.

In the tempered glass sheet of the present invention, it is preferred to attach a protective resin film onto at least one surface of the tempered glass sheet, and it is more preferred to attach the protective resin film onto each of both surfaces of the tempered glass sheet. A material for the protective resin film is preferably capable of being detachably attached onto the surface of the tempered glass sheet. With this, a situation in which a flaw is created in the surface of the tempered glass sheet during the transportation or shipment of the tempered glass sheet to lower the mechanical strength of the tempered glass sheet can be easily prevented. Further, in the case of, for example, forming a functional film such as a transparent conductive film on the surface of the tempered glass sheet, the protective resin film can be easily peeled from the surface of the tempered glass sheet. From the viewpoint of attachment efficiency, the size (longitudinal dimension×lateral dimension) of the protective resin film is preferably smaller than the size of the tempered glass sheet. From the viewpoint of preventing the tempered glass sheet from having a surface flaw, at least one of the longitudinal dimension and lateral dimension of the protective resin film is preferably set equal to or larger than that of the tempered glass sheet, and the surface of the tempered glass sheet is more preferably covered completely with the protective resin film. It should be noted that the thickness of the protective resin film is preferably smaller than the sheet thickness of the tempered glass sheet from the viewpoint of a packaging ratio or the like.

A tempered glass container of the present invention comprises the tempered glass described above. Thus, technical features (suitable characteristics, suitable component ranges, and the like) of the tempered glass container of the present invention are the same as the technical features of the tempered glass of the present invention in principle. Detailed descriptions of the technical features of the tempered glass container of the present invention are omitted here.

The tempered glass container of the present invention is preferably obtained by processing a glass tube into a glass container and then subjecting the glass container to tempering treatment. The glass tube preferably has an outer diameter dimension of from 5 to 50 mm, from 5 to 40 mm, or from 5 to 30 mm, and preferably has a thickness dimension of from 0.3 to 2 mm, from 0.3 to 1.5 mm, or from 0.4 to 1.5 mm.

A glass to be tempered of the present invention is a glass to be subjected to tempering treatment, comprising as a glass composition, in terms of mol %, 50 to 80% of $SiO_2$, 5 to 30% of $Al_2O_3$, 0 to 2% of $Li_2O$, 5 to 25% of $Na_2O$, and 0 to 5% of $K_2O$, and being substantially free of $As_2O_3$, $Sb_2O_3$, PbO, and F. Thus, technical features (suitable characteristics, suitable component ranges, and the like) of the glass to be tempered of the present invention are the same as the technical features of the tempered glass of the present invention and the tempered glass sheet of the present invention in principle, and hence detailed descriptions of the technical features of the glass to be tempered of the present invention are omitted here.

The glass to be tempered of the present invention has a crack resistance of preferably 100 gf or more, 200 gf or more, 300 gf or more, 400 gf or more, 500 gf or more, 600 gf or more, 700 gf or more, 800 gf or more, 900 gf or more, or 1,000 gf or more. As the crack resistance increases, a surface flaw is less liable to be created on a tempered glass to be obtained, and hence the mechanical strength of the tempered glass is less liable to lower. In addition, the mechanical strength is less liable to vary. In addition, when the crack resistance is high, a lateral crack is hardly generated at the time of post-tempering cutting such as scribe cutting, and hence the post-tempering scribe cutting can be easily performed appropriately. As a result, the manufacturing cost of a device can be easily reduced.

In a glass sheet to be tempered of the present invention, it is preferred to attach a protective resin film onto at least one surface of the glass sheet to be tempered, and it is more preferred to attach the protective resin film onto each of both surfaces of the glass sheet to be tempered. A material for the protective resin film is preferably capable of being detachably attached onto the surface of the glass sheet to be tempered. With this, a situation in which a flaw is created in the surface of the glass sheet to be tempered during the transportation or shipment of the glass sheet to be tempered to lower the mechanical strength of the tempered glass sheet can be easily prevented. Further, in the case of, for example, subjecting the glass sheet to be tempered to ion exchange treatment, the protective resin film can be easily peeled from the surface of the glass sheet to be tempered. From the viewpoint of attachment efficiency, the size (longitudinal dimension×lateral dimension) of the protective resin film is preferably smaller than the size of the glass sheet to be tempered. From the viewpoint of preventing the glass sheet to be tempered from having a surface flaw, at least one of the longitudinal dimension and lateral dimension of the protective resin film is preferably set equal to or larger than that of the glass sheet to be tempered, and the surface of the glass sheet to be tempered is more preferably covered completely with the protective resin film. It should be noted that the thickness of the protective resin film is preferably smaller than the sheet thickness of the glass sheet to be tempered from the viewpoint of a packaging ratio or the like.

Figure 1B:
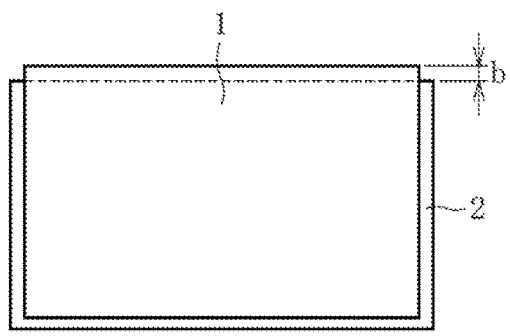
FIG. 1b is a schematic plan view illustrating a second example of the attachment state of the protective resin film with respect to the glass sheet to be tempered according to the embodiment of the present invention.
Figure 1C:
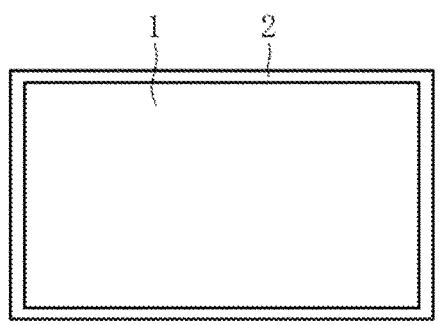
FIG. 1c is a schematic plan view illustrating a third example of the attachment state of the protective resin film with respect to the glass sheet to be tempered according to the embodiment of the present invention.
Figure 1D:
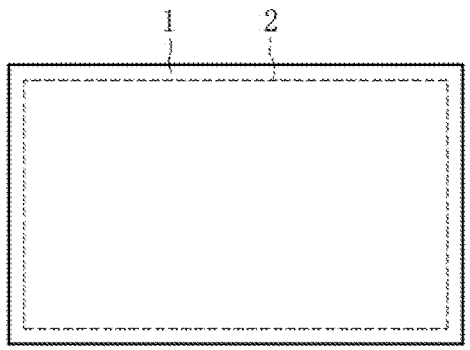
FIG. 1d is a schematic plan view illustrating a fourth example of the attachment state of the protective resin film with respect to the glass sheet to be tempered according to the embodiment of the present invention.

Specific examples of the case where the protective resin film is attached onto the glass sheet to be tempered are described below. As illustrated in FIG. 1a, in such a manner that a protective resin film 1 having a rectangular shape is protruded beyond two parallel sides of a glass sheet to be tempered 2 having a rectangular shape and a protruding dimension a beyond each of the two sides is set to about 10 nm, the protective resin film 1 may be attached onto one surface, or each of both surfaces, of the glass sheet to be tempered 2. In addition, as illustrated in FIG. 1b, in such a manner that the protective resin film 1 having a rectangular shape is protruded beyond only one side of the glass sheet to be tempered 2 having a rectangular shape and a protruding dimension b beyond the side is set to about 10 mm, the protective resin film 1 may be attached onto one surface, or each of both surfaces, of the glass sheet to be tempered 2. Further, as illustrated in FIG. 1c, in such a manner that the four sides of the glass sheet to be tempered 2 having a rectangular shape are protruded beyond the protective resin film 1 having a rectangular shape, the protective resin film 1 may be attached onto one surface, or each of both surfaces, of the glass sheet to be tempered 2. In addition, as illustrated in FIG. 1d, in such a manner that the protective resin film 1 having a rectangular shape is protruded beyond the four sides of the glass sheet to be tempered 2 having a rectangular shape, the protective resin film 1 may be attached onto one surface, or each of both surfaces, of the glass sheet to be tempered 2. It should be noted that the attachment states of the protective resin film 1 with respect to the glass sheet to be tempered 2 as described above may be similarly applied to the attachment state of the protective resin film with respect to the above-mentioned tempered glass sheet.

When the glass to be tempered of the present invention is subjected to ion exchange treatment in a $KNO_3$ molten salt (having no history of being used) at 430° C., it is preferred that the compression stress value of a compression stress layer in a surface thereof be 300 MPa or more and the thickness of the compression stress layer be 10 μm or more, it is more preferred that the compression stress of the surface thereof be 400 MPa or more and the thickness of the compression stress layer be 15 μm or more, and it is particularly preferred that the compression stress of the surface thereof be 500 MPa or more and the thickness of the compression stress layer be 15 μm or more.

The glass to be tempered of the present invention preferably has a ratio $CS_2/CS_1$ of a compression stress value $CS_2$ to a compression stress value CS) of 0.7 or more, 0.71 or more, 0.72 or more, or 0.73 or more, the compression stress value $CS_1$ being determined for a compression stress layer that is obtained by subjecting the glass to be tempered to ion exchange treatment in a potassium nitrate molten salt free of a history of being used, the compression stress value $CS_2$ being determined for a compression stress layer that is obtained by subjecting the glass to be tempered to ion exchange treatment in a potassium nitrate molten salt comprising 20,000 ppm (by mass) of Na ions. With this, even when a deteriorated ion exchange solution is used, the ion exchange performance can be easily maintained. As a result, the replacement interval of the ion exchange solution can be lengthened.

When the ion exchange treatment is performed, the temperature of the $KNO_3$ molten salt is preferably from 400 to 550° C., and the ion exchange time is preferably from 0.5 to 10 hours, particularly preferably from 0.5 to 4 hours. Under the conditions, the compression stress layer can be properly formed easily. It should be noted that the glass to be tempered of the present invention has the above-mentioned glass composition, and hence the compression stress value and thickness of the compression stress layer can be increased without using a mixture of a $KNO_3$ molten salt and a $NaNO_3$ molten salt or the like.

The glass to be tempered, tempered glass, tempered glass container, and tempered glass sheet of the present invention can be produced as described below.

First, glass raw materials, which have been blended so as to have the above-mentioned glass composition, are loaded in a continuous melting furnace, are melted by heating at 1,500 to 1,650° C., and are fined. After that, the resultant is fed to a forming apparatus, is formed into, for example, a sheet shape or a tube shape, and is annealed. Thus, a glass sheet, a glass tube, or the like can be produced.

An overflow down-draw method is preferably adopted as a method of forming the glass sheet. The overflow down-draw method is a method by which a high-quality glass sheet can be produced in a large amount, and by which even a large-size glass sheet can be easily produced. In addition, the method allows flaws on the surface of the glass sheet to be reduced to the extent possible.

Various forming methods other than the overflow down-draw method may also be adopted. For example, forming methods such as a float method, a down draw method (such as a slot down method or a re-draw method), a roll out method, and a press method may be adopted.

In addition, as a method of forming a glass tube, it is preferred to adopt a down-draw method, an up-draw method, a Vello method, or a Danner method. Particularly from the viewpoint of production efficiency, the Danner method is preferably adopted. In this context, the Danner method is a method comprising winding molten glass on the surface of a rotating cylindrical refractory, allowing the glass to flow down to the end of the refractory, and drawing the glass out of the end of the refractory into a tube shape while blowing air into the glass. After that, the glass tube can be processed into the glass container through local heating with a gas burner. It should be noted that residual strain generated at the time of the processing can be removed by putting the glass tube into an annealing furnace.

Next, the resultant glass to be tempered is subjected to tempering treatment, thereby being able to produce a tempered glass. The resultant tempered glass may be cut into pieces having predetermined sizes before the tempering treatment, but the cutting is preferably performed after the tempering treatment from the viewpoint of the manufacturing efficiency of a device.

The tempering treatment is preferably ion exchange treatment. Conditions for the ion exchange treatment are not particularly limited, and optimum conditions may be selected in view of, for example, the viscosity properties, applications, thickness, inner tensile stress, and dimensional change of glass. The ion exchange treatment can be performed, for example, by immersing the glass to be tempered in a $KNO_3$ molten salt at 400 to 550° C. for 0.5 to 10 hours. Particularly when the ion exchange of K ions in the $KNO_3$ molten salt with Na components in the glass is performed, it is possible to form efficiently a compression stress layer in a surface of the glass.

It is preferred that an end surface of the glass sheet to be tempered be subjected to etching treatment and then the glass sheet to be tempered be subjected to ion exchange treatment to provide the tempered glass sheet. With this, the end surface is brought into a smooth state, and a compression stress layer is formed in such end surface. Accordingly, the mechanical strength, in particular, three-point bending strength, of the tempered glass sheet can be significantly enhanced. An etching liquid to be used in the etching treatment is preferably a solution comprising F, particularly preferably an aqueous solution comprising HF. With this, the end surface can be easily etched so as to be brought into a smooth state.

It is also preferred that an end surface of the glass sheet to be tempered be fire-polished and then the glass sheet to be tempered be subjected to ion exchange treatment to provide the tempered glass sheet. With this, the end surface is brought into a smooth state, and a compression stress layer is formed in such end surface. Accordingly, the mechanical strength, in particular, three-point bending strength, of the tempered glass sheet can be significantly enhanced.

It is also preferred that an end surface of the glass sheet to be tempered be subjected to polishing processing, in particular, chamfering processing and then the glass sheet to be tempered be subjected to ion exchange treatment to provide the tempered glass sheet. With this, the end surface is brought into a smooth state, and a compression stress layer is formed in such end surface. Accordingly, the mechanical, strength, in particular, three-point bending strength, of the tempered glass sheet can be significantly enhanced.

When the tempered glass sheet is cut, laser cutting or scribe cutting is preferably adopted. A $CO_2$ laser or a short-pulse laser is preferably used in the laser cutting. With this, an unintended crack is hardly developed at the time of the cutting.

When the tempered glass sheet is subjected to the scribe cutting, it is preferred that the depth of an initial cut (scribing cut) be larger than the thickness of the compression stress layer and the tempered glass sheet have an internal tensile stress of 100 MPa or less, 80 MPa or less, 70 MPa or less, 60 MPa or less, 40 MPa or less, 30 MPa or less, 25 MPa or less, 23 MPa or less, or 20 MPa or less. In addition, scribing is preferably started from one end of the tempered glass sheet or from a region at a distance of 5 mm or more therefrom, and the scribing is preferably stopped at a region at a distance of 5 mm or more from the other end of the tempered glass sheet. Further, a snapping step is preferably provided after the scribing. With this, an unintended crack is hardly generated at the time of the scribing, and hence the post-tempering scribe cutting can be easily performed appropriately. It should be noted that the internal tensile stress can be calculated by the following equation 1. For example, a wheel cutter having a protrusion on its outer circumference is preferably used for forming the scribing cut.

Internal tensile stress=(compression stress value of compression stress layer×thickness of compression stress layer)/{sheet thickness−2×(thickness of compression stress layer)}  <Equation 1>

It is preferred that after the glass sheet to be tempered has been subjected to ion exchange treatment to provide the tempered glass sheet, an end surface of the tempered glass sheet be subjected to etching treatment, and it is more preferred that after the glass sheet to be tempered has been subjected to ion exchange treatment to provide the tempered glass sheet, an end surface of the tempered glass sheet be subjected to polishing processing, in particular, chamfering processing and then the end surface be subjected to etching treatment. With this, the end surface is brought into a smooth state, and hence even when the end surface has no compression stress layer formed therein, the mechanical strength, in particular, three-point bending strength, of the tempered glass sheet can be enhanced. An etching liquid to be used in the etching treatment is preferably a solution comprising F, particularly preferably an aqueous solution comprising HF. With this, the end surface can be easily etched so as to be brought into a smooth state.

EXAMPLES

The present invention is hereinafter described based on Examples. It should be noted that the following examples are merely illustrative. The present invention is by no means limited to these examples.

Tables 1 to 8 show examples of the present invention (sample Nos. 1 to 45).

TABLE 1

| | | Example | | | | | |
|---|---|---|---|---|---|---|---|
| | | No. 1 | No. 2 | No. 3 | No. 4 | No. 5 | No. 6 |
| Glass com-position (mol %) | $SiO_2$ | 68.2 | 67.4 | 67.2 | 66.4 | 68.8 | 68.0 |
| | $Al_2O_3$ | 11.6 | 12.2 | 11.6 | 12.3 | 11.6 | 12.3 |
| | MgO | 2.5 | 2.5 | 2.5 | 2.5 | 0.8 | 0.8 |
| | $B_2O_3$ | 4.9 | 5.1 | 6.0 | 6.0 | 5.2 | 5.2 |
| | $Na_2O$ | 11.3 | 11.4 | 11.3 | 11.4 | 12.4 | 12.5 |
| | $K_2O$ | 1.4 | 1.4 | 1.4 | 1.4 | 1.1 | 1.1 |
| | $SnO_2$ | 0.1 | 0.1 | 0.1 | 0.1 | 0.1 | 0.1 |
| $Li_2O + Na_2O + K_2O$ | | 12.7 | 12.8 | 12.7 | 12.8 | 13.5 | 13.6 |
| $MgO + CaO + SrO + BaO$ | | 2.48 | 2.47 | 2.48 | 2.50 | 0.78 | 0.81 |
| $Li_2O + Na_2O + K_2O + MgO + CaO + SrO + BaO$ | | 15.20 | 15.24 | 15.19 | 15.26 | 14.29 | 14.39 |
| $MgO/(Li_2O + Na_2O + K_2O + MgO + CaO + SrO + BaO)$ | | 0.16 | 0.16 | 0.16 | 0.16 | 0.05 | 0.06 |
| $(Al_2O_3 + B_2O_3)/SiO_2$ | | 0.24 | 0.26 | 0.26 | 0.28 | 0.24 | 0.26 |
| Density (g/cm³) | | 2.39 | 2.39 | 2.38 | 2.38 | 2.39 | 2.39 |
| α (×10⁻⁷/° C.) | | 74 | 75 | 75 | 75 | 77 | 78 |
| Ps (° C.) | | 563 | 569 | 556 | 561 | 557 | 561 |
| Ta (° C.) | | 615 | 624 | 607 | 614 | 607 | 614 |
| Ts (° C.) | | 885 | 899 | 881 | 884 | 862 | 892 |
| $10^4$ dPa·s (° C.) | | 1,323 | 1,330 | 1,305 | 1,322 | 1,323 | 1,343 |
| $10^3$ dPa·s (° C.) | | 1,537 | 1,538 | 1,518 | 1,526 | 1,550 | 1,561 |
| $10^{2.5}$ dP·s (° C.) | | 1,670 | 1,671 | 1,649 | 1,652 | 1,692 | 1,695 |
| TL (° C.) | | 1,139 | >1,160 | >1,160 | >1,160 | >1,160 | 1,160 |
| LogηTL (dPa·s) | | 5.1 | <5.1 | <4.9 | <5.0 | <4.9 | 5.1 |
| Chemical resistance [10 mass % hydrochloric acid at 80° C. for 24 h] Mass reduction (mg/cm²) | | 0.3 | 0.7 | 0.7 | 1.4 | 0.3 | 0.5 |
| $CS_1$ (MPa) | | 838 | 867 | 826 | 845 | 871 | 906 |
| $DOL_1$ (μm) | | 37 | 39 | 35 | 36 | 38 | 40 |
| $CS_2$ (MPa) | | 598 | 624 | 610 | 620 | 647 | 670 |
| $DOL_2$ (μm) | | 35 | 36 | 34 | 34 | 35 | 38 |
| $CS_2/CS_1$ | | 0.71 | 0.72 | 0.74 | 0.73 | 0.74 | 0.74 |

TABLE 2

| | | Example | | | | | |
|---|---|---|---|---|---|---|---|
| | | No. 7 | No. 8 | No. 9 | No. 10 | No. 11 | No. 12 |
| Glass composition (mol %) | $SiO_2$ | 67.8 | 67.2 | 68.0 | 69.6 | 68.7 | 67.8 |
| | $Al_2O_3$ | 11.6 | 12.3 | 11.5 | 10.8 | 10.8 | 10.8 |
| | MgO | 0.8 | 0.8 | 1.6 | 1.6 | 1.6 | 1.6 |
| | $B_2O_3$ | 6.1 | 6.0 | 3.4 | 2.6 | 3.6 | 4.7 |
| | $Na_2O$ | 12.4 | 12.5 | 15.4 | 15.3 | 15.3 | 15.2 |
| | $K_2O$ | 1.1 | 1.1 | 0.0 | 0.0 | 0.0 | 0.0 |
| | $SnO_2$ | 0.1 | 0.1 | 0.1 | 0.1 | 0.1 | 0.1 |
| $Li_2O + Na_2O + K_2O$ | | 13.5 | 13.6 | 15.4 | 15.3 | 15.3 | 15.2 |
| $MgO + CaO + SrO + BaO$ | | 0.80 | 0.81 | 1.60 | 1.60 | 1.60 | 1.59 |
| $Li_2O + Na_2O + K_2O + MgO + CaO + SrO + BaO$ | | 14.34 | 14.41 | 17.00 | 16.90 | 16.87 | 16.77 |
| $MgO/(Li_2O + Na_2O + K_2O + MgO + CaO + SrO + BaO)$ | | 0.06 | 0.06 | 0.09 | 0.09 | 0.09 | 0.09 |
| $(Al_2O_3 + B_2O_3)/SiO_2$ | | 0.26 | 0.27 | 0.22 | 0.19 | 0.21 | 0.23 |
| Density (g/cm³) | | 2.39 | 2.38 | 2.42 | 2.42 | 2.42 | 2.42 |
| $\alpha$ ($\times 10^{-7}$/° C.) | | 77 | 78 | 81 | 81 | 80 | 80 |
| Ps (° C.) | | 551 | 556 | 560 | 562 | 557 | 553 |
| Ta (° C.) | | 601 | 608 | 606 | 608 | 601 | 596 |
| Ts (° C.) | | 856 | 873 | 835 | 840 | 824 | 810 |
| $10^4$ dPa·s (° C.) | | 1,302 | 1,326 | 1,263 | 1,266 | 1,249 | 1,227 |
| $10^3$ dPa·s (° C.) | | 1,529 | 1,545 | 1,487 | 1,499 | 1,478 | 1,454 |
| $10^{2.5}$ dPa·s (° C.) | | 1,667 | 1,680 | 1,624 | 1,646 | 1,622 | 1,597 |
| TL (° C.) | | 1,032 | 1,141 | 981 | 979 | 963 | 940 |
| Log$\eta$TL (dPa·s) | | 5.8 | 5.1 | 5.9 | 6.0 | 6.0 | 6.0 |
| Chemical resistance [10 mass % hydrochloric acid at 80° C. for 24 h] Mass reduction (mg/cm²) | | 0.5 | 0.9 | 0.3 | 0.1 | 0.1 | 0.2 |
| $CS_1$ (MPa) | | 855 | 887 | 909 | 821 | 846 | 853 |
| $DOL_1$ (μm) | | 36 | 38 | 32 | 31 | 29 | 27 |
| $CS_2$ (MPa) | | 639 | 661 | 695 | 652 | 645 | 664 |
| $DOL_2$ (μm) | | 33 | 35 | 30 | 29 | 27 | 25 |
| $CS_2/CS_1$ | | 0.75 | 0.74 | 0.76 | 0.79 | 0.76 | 0.78 |

TABLE 3

| | | Example | | | | | |
|---|---|---|---|---|---|---|---|
| | | No. 13 | No. 14 | No. 15 | No. 16 | No. 17 | No. 18 |
| Glass composition (mol %) | $SiO_2$ | 68.1 | 67.1 | 69.9 | 68.8 | 68.9 | 68.0 |
| | $Al_2O_3$ | 11.5 | 11.6 | 10.9 | 10.8 | 11.5 | 11.5 |
| | MgO | 1.6 | 1.6 | 1.6 | 1.6 | 1.6 | 1.6 |
| | $B_2O_3$ | 3.6 | 4.5 | 2.5 | 3.6 | 3.6 | 4.4 |
| | $Na_2O$ | 14.4 | 14.4 | 14.3 | 14.3 | 14.3 | 14.3 |
| | $K_2O$ | 0.7 | 0.7 | 0.7 | 0.7 | 0.0 | 0.0 |
| | $SnO_2$ | 0.1 | 0.1 | 0.1 | 0.1 | 0.1 | 0.1 |
| $Li_2O + Na_2O + K_2O$ | | 15.1 | 15.1 | 15.0 | 15.0 | 14.3 | 14.4 |
| $MgO + CaO + SrO + BaO$ | | 1.62 | 1.64 | 1.61 | 1.64 | 1.61 | 1.63 |
| $Li_2O + Na_2O + K_2O + MgO + CaO + SrO + BaO$ | | 16.72 | 16.74 | 16.63 | 16.66 | 15.95 | 16.00 |
| $MgO/(Li_2O + Na_2O + K_2O + MgO + CaO + SrO + BaO)$ | | 0.10 | 0.10 | 0.10 | 0.10 | 0.10 | 0.10 |
| $(Al_2O_3 + B_2O_3)/SiO_2$ | | 0.22 | 0.24 | 0.19 | 0.21 | 0.22 | 0.23 |
| Density (g/cm³) | | 2.42 | 2.42 | 2.42 | 2.42 | 2.41 | 2.41 |
| $\alpha$ ($\times 10^{-7}$/° C.) | | 82 | 82 | 81 | 81 | 77 | 77 |
| Ps (° C.) | | 558 | 554 | 561 | 556 | 568 | 561 |
| Ta (° C.) | | 605 | 599 | 607 | 600 | 617 | 608 |
| Ts (° C.) | | 840 | 826 | 843 | 827 | 864 | 846 |
| $10^4$ dPa·s (° C.) | | 1,275 | 1,250 | 1,278 | 1,255 | 1,296 | 1,281 |
| $10^3$ dPa·s (° C.) | | 1,503 | 1,474 | 1,506 | 1,486 | 1,519 | 1,504 |
| $10^{2.5}$ dPa·s (° C.) | | 1,641 | 1,613 | 1,645 | 1,632 | 1,653 | 1,640 |
| TL (° C.) | | 940 | 953 | 1,001 | 1,006 | 960 | 973 |
| Log$\eta$TL (dPa·s) | | 6.4 | 6.1 | 5.9 | 5.6 | 6.5 | 6.2 |
| Chemical resistance [10 mass % hydrochloric acid at 80° C. for 24 h] Mass reduction (mg/cm²) | | 0.3 | 0.6 | 0.1 | 0.5 | 0.1 | 0.3 |
| $CS_1$ (MPa) | | 860 | 863 | 816 | 828 | 860 | 831 |
| $DOL_1$ (μm) | | 33 | 31 | 34 | 32 | 31 | 32 |
| $CS_2$ (MPa) | | 651 | 655 | 623 | 624 | 673 | 662 |
| $DOL_2$ (μm) | | 31 | 29 | 32 | 29 | 28 | 26 |
| $CS_2/CS_1$ | | 0.76 | 0.76 | 0.76 | 0.75 | 0.78 | 0.80 |

TABLE 4

| | | Example | | | | | |
|---|---|---|---|---|---|---|---|
| | | No. 19 | No. 20 | No. 21 | No. 22 | No. 23 | No. 24 |
| Glass composition (mol %) | $SiO_2$ | 70.4 | 69.7 | 68.5 | 68.1 | 67.8 | 67.6 |
| | $Al_2O_3$ | 10.7 | 10.8 | 11.4 | 11.4 | 11.5 | 11.4 |
| | MgO | 1.6 | 1.6 | 1.6 | 1.6 | 1.6 | 1.6 |
| | $B_2O_3$ | 2.8 | 3.6 | 3.7 | 3.8 | 3.7 | 3.7 |
| | $Na_2O$ | 14.3 | 14.2 | 13.9 | 13.9 | 13.9 | 14.5 |
| | $K_2O$ | 0.0 | 0.0 | 0.7 | 1.0 | 1.4 | 1.0 |
| | $SnO_2$ | 0.1 | 0.1 | 0.1 | 0.1 | 0.1 | 0.1 |
| $Li_2O + Na_2O + K_2O$ | | 14.3 | 14.3 | 14.6 | 15.0 | 15.3 | 15.5 |
| $MgO + CaO + SrO + BaO$ | | 1.60 | 1.61 | 1.61 | 1.60 | 1.61 | 1.62 |
| $Li_2O + Na_2O + K_2O + MgO + CaO + SrO + BaO$ | | 15.93 | 15.86 | 16.26 | 16.59 | 16.92 | 17.13 |
| $MgO/(Li_2O + Na_2O + K_2O + MgO + CaO + SrO + BaO)$ | | 0.10 | 0.10 | 0.10 | 0.10 | 0.09 | 0.09 |
| $(Al_2O_3 + B_2O_3)/SiO_2$ | | 0.19 | 0.21 | 0.22 | 0.22 | 0.22 | 0.22 |
| Density (g/cm³) | | 2.41 | 2.41 | 2.41 | 2.42 | 2.42 | 2.42 |
| $\alpha$ ($\times 10^{-7}$/° C.) | | 77 | 77 | 81 | 82 | 84 | 84 |
| Ps (° C.) | | 570 | 564 | 564 | 560 | 554 | 556 |
| Ta (° C.) | | 619 | 610 | 612 | 607 | 600 | 602 |
| Ts (° C.) | | 865 | 847 | 856 | 846 | 836 | 830 |
| $10^4$ dPa·s (° C.) | | 1,301 | 1,292 | 1,297 | 1,284 | 1,263 | 1,269 |
| $10^3$ dPa·s (° C.) | | 1,530 | 1,520 | 1,522 | 1,511 | 1,491 | 1,495 |
| $10^{2.5}$ dPa·s (° C.) | | 1,673 | 1,658 | 1,657 | 1,656 | 1,630 | 1,636 |
| TL (° C.) | | 1,021 | 1,034 | 974 | 964 | 957 | 967 |

TABLE 4-continued

|  | Example | | | | | |
| --- | --- | --- | --- | --- | --- | --- |
|  | No. 19 | No. 20 | No. 21 | No. 22 | No. 23 | No. 24 |
| LogηTL (dPa·s) | 5.9 | 5.6 | 6.3 | 6.2 | 6.2 | 6.1 |
| Chemical resistance [10 mass % hydrochloric acid at 80° C. for 24 h] Mass reduction (mg/cm$^2$) | 0.3 | 0.1 | 0.2 | 0.2 | 0.3 | 0.4 |
| CS$_1$ (MPa) | 830 | 845 | 903 | 893 | 873 | 882 |
| DOL$_1$ (μm) | 32 | 30 | 34 | 35 | 37 | 35 |
| CS$_2$ (MPa) | 645 | 649 | 674 | 656 | 639 | 651 |
| DOL$_2$ (μm) | 30 | 27 | 32 | 33 | 35 | 33 |
| CS$_2$/CS$_1$ | 0.78 | 0.77 | 0.75 | 0.75 | 0.73 | 0.74 |

TABLE 5

|  |  | Example | | | | | |
| --- | --- | --- | --- | --- | --- | --- | --- |
|  |  | No. 25 | No. 26 | No. 27 | No. 28 | No. 29 | No. 30 |
| Glass composition (mol %) | SiO$_2$ | 67.4 | 67.5 | 66.6 | 66.8 | 66.3 | 67.4 |
|  | Al$_2$O$_3$ | 11.7 | 11.7 | 11.6 | 11.8 | 11.6 | 10.9 |
|  | MgO | 1.6 | 1.6 | 1.6 | 1.6 | 0.8 | 0.8 |
|  | B$_2$O$_3$ | 3.5 | 3.2 | 3.5 | 3.1 | 6.3 | 6.3 |
|  | Na$_2$O | 14.4 | 15.2 | 15.4 | 15.2 | 13.8 | 13.4 |
|  | K$_2$O | 1.3 | 0.7 | 1.0 | 1.3 | 1.1 | 1.0 |
|  | SnO$_2$ | 0.1 | 0.1 | 0.1 | 0.1 | 0.1 | 0.1 |
| Li$_2$O + Na$_2$O + K$_2$O |  | 15.7 | 15.9 | 16.5 | 16.5 | 14.9 | 14.5 |
| MgO + CaO + SrO + BaO |  | 1.64 | 1.64 | 1.64 | 1.66 | 0.82 | 0.81 |
| Li$_2$O + Na$_2$O + K$_2$O + MgO + CaO + SrO + BaO |  | 17.35 | 17.59 | 18.11 | 18.19 | 15.73 | 15.28 |
| MgO/(Li$_2$O + Na$_2$O + K$_2$O + MgO + CaO + SrO + BaO) |  | 0.09 | 0.09 | 0.09 | 0.09 | 0.05 | 0.05 |
| (Al$_2$O$_3$ + B$_2$O$_3$)/SiO$_2$ |  | 0.23 | 0.22 | 0.23 | 0.22 | 0.27 | 0.25 |
| Density (g/cm$^3$) |  | 2.43 | 2.43 | 2.44 | 2.44 | 2.40 | 2.41 |
| α (×10$^{-7}$/° C.) |  | 85 | 85 | 86 | 88 | 82 | 79 |
| Ps (° C.) |  | 552 | 552 | 549 | 550 | 542 | 545 |
| Ta (° C.) |  | 597 | 596 | 592 | 593 | 586 | 588 |
| Ts (° C.) |  | 826 | 817 | 808 | 815 | 805 | 803 |
| 10$^4$ dPa·s (° C.) |  | 1,282 | 1,273 | 1,233 | 1,257 | 1,223 | 1,229 |
| 10$^3$ dPa·s (° C.) |  | 1,504 | 1,494 | 1,459 | 1,479 | 1,458 | 1,466 |
| 10$^{2.5}$ dPa·s (° C.) |  | 1,645 | 1,633 | 1,599 | 1,616 | 1,607 | 1,622 |
| TL (° C.) |  | 908 | 923 | 909 | 893 | 977 | 986 |
| LogηTL (dPa·s) |  | 6.6 | 6.4 | 6.4 | 6.7 | 5.6 | 5.6 |
| Chemical resistance [10 mass % hydrochloric acid at 80° C. for 24 h] Mass reduction (mg/cm$^2$) |  | 0.6 | 0.6 | 0.7 | 0.7 | 1.0 | 0.5 |
| CS$_1$ (MPa) |  | 871 | 879 | 849 | 855 | 871 | 858 |
| DOL$_1$ (μm) |  | 36 | 33 | 35 | 36 | 32 | 31 |
| CS$_2$ (MPa) |  | 645 | 659 | 636 | 634 | 653 | 632 |
| DOL$_2$ (μm) |  | 35 | 32 | 32 | 35 | 30 | 30 |
| CS$_2$/CS$_1$ |  | 0.74 | 0.75 | 0.75 | 0.74 | 0.75 | 0.74 |

TABLE 6

|  |  | Example | | | | | |
| --- | --- | --- | --- | --- | --- | --- | --- |
|  |  | No. 31 | No. 32 | No. 33 | No. 34 | No. 35 | No. 36 |
| Glass composition (mol %) | SiO$_2$ | 68.3 | 65.9 | 66.7 | 67.3 | 64.8 | 65.6 |
|  | Al$_2$O$_3$ | 10.3 | 11.6 | 11.0 | 10.3 | 11.6 | 11.0 |
|  | MgO | 0.8 | 0.8 | 0.8 | 0.8 | 0.8 | 0.8 |
|  | B$_2$O$_3$ | 6.1 | 7.1 | 7.0 | 7.2 | 8.1 | 8.0 |
|  | Na$_2$O | 13.4 | 13.5 | 13.3 | 13.3 | 13.5 | 13.5 |
|  | K$_2$O | 1.0 | 1.0 | 1.0 | 1.0 | 1.0 | 1.0 |
|  | SnO$_2$ | 0.1 | 0.1 | 0.1 | 0.1 | 0.1 | 0.1 |
| Li$_2$O + Na$_2$O + K$_2$O |  | 14.4 | 14.5 | 14.4 | 14.3 | 14.5 | 14.5 |
| MgO + CaO + SrO + BaO |  | 0.79 | 0.82 | 0.82 | 0.81 | 0.82 | 0.82 |
| Li$_2$O + Na$_2$O + K$_2$O + MgO + CaO + SrO + BaO |  | 15.21 | 15.36 | 15.20 | 15.13 | 15.35 | 15.31 |
| MgO/(Li$_2$O + Na$_2$O + K$_2$O + MgO + CaO + SrO + BaO) |  | 0.05 | 0.05 | 0.05 | 0.05 | 0.05 | 0.05 |
| (Al$_2$O$_3$ + B$_2$O$_3$)/SiO$_2$ |  | 0.24 | 0.28 | 0.27 | 0.26 | 0.30 | 0.29 |
| Density (g/cm$^3$) |  | 2.41 | 2.40 | 2.40 | 2.40 | 2.39 | 2.40 |
| α (×10$^{-7}$/° C.) |  | 79 | 80 | 80 | 79 | 80 | 80 |
| Ps (° C.) |  | 546 | 541 | 540 | 540 | 535 | 535 |
| Ta (° C.) |  | 589 | 585 | 583 | 582 | 578 | 577 |
| Ts (° C.) |  | 799 | 804 | 793 | 786 | 793 | 783 |
| 10$^4$ dPa·s (° C.) |  | 1,206 | 1,226 | 1,214 | 1,190 | 1,224 | 1,194 |
| 10$^3$ dPa·s (° C.) |  | 1,446 | 1,457 | 1,453 | 1,427 | 1,450 | 1,430 |
| 10$^{2.5}$ dPa·s (° C.) |  | 1,595 | 1,603 | 1,601 | 1,578 | 1,586 | 1,578 |
| TL (° C.) |  | 967 | 985 | 984 | 942 | 992 | 943 |
| LogηTL (dPa·s) |  | 5.6 | 5.6 | 5.5 | 5.7 | 5.5 | 5.7 |
| Chemical resistance [10 mass % hydrochloric acid at 80° C. for 24 h] Mass reduction (mg/cm$^2$) |  | 0.2 | 1.3 | 0.8 | 0.4 | 15.3 | 1.2 |
| CS$_1$ (MPa) |  | 830 | 870 | 843 | 823 | 850 | 824 |
| DOL$_1$ (μm) |  | 30 | 31 | 31 | 28 | 30 | 29 |
| CS$_2$ (MPa) |  | 615 | 651 | 637 | 619 | 642 | 631 |
| DOL$_2$ (μm) |  | 28 | 30 | 28 | 27 | 28 | 28 |
| CS$_2$/CS$_1$ |  | 0.74 | 0.75 | 0.75 | 0.75 | 0.75 | 0.77 |

TABLE 7

|  |  | Example | | | | | |
| --- | --- | --- | --- | --- | --- | --- | --- |
|  |  | No. 37 | No. 38 | No. 39 | No. 40 | No. 41 | No. 42 |
| Glass composition (mol %) | SiO$_2$ | 66.6 | 68.8 | 69.4 | 67.1 | 67.9 | 69.0 |
|  | Al$_2$O$_3$ | 10.3 | 10.8 | 10.2 | 11.5 | 10.9 | 10.2 |
|  | MgO | 0.8 | 1.6 | 1.6 | 1.6 | 1.6 | 1.6 |
|  | B$_2$O$_3$ | 7.8 | 3.6 | 3.7 | 4.6 | 4.5 | 4.4 |
|  | Na$_2$O | 13.3 | 14.3 | 14.3 | 14.4 | 14.2 | 14.0 |
|  | K$_2$O | 1.0 | 0.7 | 0.7 | 0.7 | 0.7 | 0.6 |
|  | SnO$_2$ | 0.1 | 0.1 | 0.1 | 0.1 | 0.1 | 0.1 |
| Li$_2$O + Na$_2$O + K$_2$O |  | 14.3 | 15.0 | 15.0 | 15.1 | 14.9 | 14.7 |
| MgO + CaO + SrO + BaO |  | 0.82 | 1.64 | 1.62 | 1.65 | 1.65 | 1.65 |
| Li$_2$O + Na$_2$O + K$_2$O + MgO + CaO + SrO + BaO |  | 15.11 | 16.68 | 16.60 | 16.77 | 16.56 | 16.31 |

TABLE 7-continued

| | Example | | | | | |
|---|---|---|---|---|---|---|
| | No. 37 | No. 38 | No. 39 | No. 40 | No. 41 | No. 42 |
| MgO/(Li$_2$O + Na$_2$O + K$_2$O + MgO + CaO + SrO + BaO) | 0.05 | 0.10 | 0.10 | 0.10 | 0.10 | 0.10 |
| (Al$_2$O$_3$ + B$_2$O$_3$)/SiO$_2$ | 0.27 | 0.21 | 0.20 | 0.24 | 0.23 | 0.21 |
| Density (g/cm$^3$) | 2.40 | 2.42 | 2.42 | 2.42 | 2.42 | 2.42 |
| α (×10$^{-7}$/° C.) | 79 | 82 | 81 | 81 | 81 | 80 |
| Ps (° C.) | 536 | 557 | 556 | 552 | 553 | 533 |
| Ta (° C.) | 578 | 602 | 600 | 596 | 597 | 596 |
| Ts (° C.) | 779 | 830 | 825 | 822 | 818 | 812 |
| 10$^4$ dPa · s (° C.) | 1,168 | 1,281 | 1,254 | 1,250 | 1,267 | 1,284 |
| 10$^3$ dPa · s (° C.) | 1,402 | 1,511 | 1,485 | 1,475 | 1,494 | 1,515 |
| 10$^{2.5}$ dPa · s (° C.) | 1,554 | 1,656 | 1,629 | 1,615 | 1,636 | 1,662 |
| TL (° C.) | 930 | 928 | 947 | 956 | 930 | 949 |
| LogηTL (dPa · s) | 5.7 | 6.5 | 6.2 | 6.0 | 6.3 | 6.1 |
| Chemical resistance [10 mass % hydrochloric acid at 80° C. for 24 h] Mass reduction (mg/cm$^2$) | 0.9 | 0.1 | 0.1 | 0.5 | 0.2 | 0.1 |
| CS$_1$ (MPa) | 812 | 876 | 850 | 909 | 886 | 856 |
| DOL$_1$ (μm) | 27 | 32 | 32 | 32 | 30 | 30 |
| CS$_2$ (MPa) | 616 | 652 | 622 | 672 | 652 | 642 |
| DOL$_2$ (μm) | 25 | 30 | 29 | 29 | 29 | 27 |
| CS$_2$/CS$_1$ | 0.76 | 0.74 | 0.73 | 0.74 | 0.74 | 0.75 |

TABLE 8

| | | Example | | |
|---|---|---|---|---|
| | | No. 43 | No. 44 | No. 45 |
| Glass composition (mol %) | SiO$_2$ | 66.0 | 66.9 | 67.7 |
| | Al$_2$O$_3$ | 11.5 | 10.9 | 10.2 |
| | MgO | 1.6 | 1.6 | 1.6 |
| | B$_2$O$_3$ | 5.7 | 5.6 | 5.5 |
| | Na$_2$O | 14.4 | 14.2 | 14.1 |
| | K$_2$O | 0.7 | 0.7 | 0.6 |
| | SnO$_2$ | 0.1 | 0.1 | 0.1 |
| Li$_2$O + Na$_2$O + K$_2$O | | 15.1 | 14.9 | 14.8 |
| MgO + CaO + SrO + BaO | | 1.65 | 1.66 | 1.65 |
| Li$_2$O + Na$_2$O + K$_2$O + MgO + CaO + SrO + BaO | | 16.72 | 16.54 | 16.44 |
| MgO/(Li$_2$O + Na$_2$O + K$_2$O + MgO + CaO + SrO + BaO) | | 0.10 | 0.10 | 0.10 |
| (Al$_2$O$_3$ + B$_2$O$_3$)/SiO$_2$ | | 0.26 | 0.25 | 0.23 |
| Density (g/cm$^3$) | | 2.42 | 2.42 | 2.42 |
| α (×10$^{-7}$/° C.) | | 82 | 80 | 80 |
| Ps (° C.) | | 549 | 547 | 546 |
| Ta (° C.) | | 592 | 590 | 588 |
| Ts (° C.) | | 811 | 809 | 796 |
| 10$^4$ dPa · s (° C.) | | 1,239 | 1,239 | 1,250 |
| 10$^3$ dPa · s (° C.) | | 1,464 | 1,467 | 1,478 |
| 10$^{2.5}$ dPa · s (° C.) | | 1,600 | 1,608 | 1,624 |
| TL (° C.) | | 944 | 959 | 966 |
| logηTL (dPa · s) | | 6.0 | 5.9 | 5.8 |
| Chemical resistance [10 mass % hydrochloric acid at 80° C. for 24 h] Mass reduction (mg/cm$^2$) | | 0.8 | 0.5 | 0.2 |

TABLE 8-continued

| | Example | | |
|---|---|---|---|
| | No. 43 | No. 44 | No. 45 |
| CS$_1$ (MPa) | 903 | 898 | 844 |
| DOL$_1$ (μm) | 30 | 30 | 28 |
| CS$_2$ (MPa) | 671 | 655 | 629 |
| DOL$_2$ (μm) | 27 | 27 | 26 |
| CS$_2$/CS$_1$ | 0.74 | 0.73 | 0.75 |

Each of the samples in the tables was produced as described below. First, glass raw materials were blended so as to have glass compositions shown in the tables, and melted at 1,600° C. using a platinum pot. The time period of the melting was set to 21 hours. Thereafter, the resultant molten glass was cast on a carbon plate and formed into a sheet shape. The resultant glass sheet was evaluated for its various properties.

The density is a value obtained through measurement by a known Archimedes method.

The thermal expansion coefficient α is a value obtained through measurement of an average thermal expansion coefficient in a temperature range of from 30 to 380° C. using a dilatometer.

The strain point Ps and the annealing point Ta are values obtained through measurement based on a method of ASTM C336.

The softening point Ts is a value obtained through measurement based on a method of ASTM C338.

The temperatures at the viscosities at high temperature of $10^{4.0}$ dPa·s, $10^{3.0}$ dPa·s, and $10^{2.5}$ dPa·s are values obtained through measurement by a platinum sphere pull up method.

The liquidus temperature TL is a value obtained through measurement of a temperature at which crystals of glass are deposited after glass powder that passes through a standard 30-mesh sieve (sieve opening: 500 μm) and remains on a 50-mesh sieve (sieve opening: 300 μm) is placed in a platinum boat and then kept for 24 hours in a gradient heating furnace.

The liquidus viscosity log $η_n$ is a value obtained through measurement of a viscosity of glass at the liquidus temperature by a platinum sphere pull up method.

The chemical resistance is a mass reduction after immersion in a 10 mass % aqueous hydrochloric acid solution at 80° C. for 24 hours. The mass reduction of each sample was measured as described below. First, the mass and surface area of each sample before its immersion in the aqueous hydrochloric acid solution were measured. Next, each sample was immersed in the aqueous hydrochloric acid solution, and then the mass of each sample was measured. Finally, the mass reduction was calculated by the following expression: (mass before immersion-mass after immersion)/(surface area before immersion).

As evident from Tables 1 to 8, each of the samples had a density of 2.44 q/cm$^3$ or less and a thermal expansion coefficient of 88×10$^{-7}$/° C. or less. Further, each of the samples has a liquidus viscosity of $10^{4.0}$ dPa·s or more, thus being able to be formed into a sheet shape by the overflow down-draw method, and moreover, has a temperature at $10^{2.5}$ dPa·s of 1,695° C. or less. This is considered to allow a large number of glass sheets to be produced at low cost with high productivity.

Subsequently, ion exchange treatment was performed through immersion in a KNO$_3$ molten salt (having no history of being used) at 430° C. for 4 hours for each of the samples both surfaces of each of which had been subjected to optical polishing. After completion of the ion exchange treatment, the surface of each of the samples was washed. Then, the stress compression value (CS$_1$) and thickness (DOL$_1$) of a compression stress layer in the surface were calculated from the number of interference fringes and each interval between the interference fringes, the interference fringes being observed with a surface stress meter (FSM-6000 manufactured by Toshiba Corporation). In the calculation, the refractive index and optical elastic constant of each of the samples were set to 1.50 and 31 [(nm/cm)/MPa], respectively. It should be noted that the glass compositions of a surface layer of glass before and after tempering treatment are different from each other microscopically, but the glass composition of the glass as a whole is not substantially changed after the tempering treatment as compared to that before the tempering treatment.

In addition, ion exchange treatment was performed through immersion in a KNO$_3$ molten salt (containing 20,000 ppm (by mass) of Na ions) at 430° C. for 4 hours for each of the samples both surfaces of each of which had been subjected to optical polishing. After completion of the ion exchange treatment, the surface of each of the samples was washed. Then, the stress compression value (CS$_2$) and thickness (DOL$_2$) of a compression stress layer in the surface were calculated from the number of interference fringes and each interval between the interference fringes, the interference fringes being observed with a surface stress meter (FSM-6000 manufactured by Toshiba Corporation). In the calculation, the refractive index and optical elastic constant of each of the samples were set to 1.50 and 31 [(nm/cm)/MPa], respectively.

As evident from Tables 1 to 8, when each sample was subjected to ion exchange treatment in the KNO$_3$ molten salt free of a history of being used, its compression stress layer had a compression stress value of from 812 to 909 MPa and a thickness of from 27 to 40 μm. In addition, when each sample was subjected to ion exchange treatment in the KNO$_3$ molten salt comprising 20,000 ppm (by mass) of Na ions, its compression stress layer had a compression stress value of from 598 to 695 MPa and a thickness of from 25 to 38 μm. Further, the CS$_2$/CS$_1$ is from 0.71 to 0.80, indicating that the ion exchange performance does not significantly change even when a deteriorated KNO$_3$ molten salt is used.

INDUSTRIAL APPLICABILITY

The tempered glass and tempered glass sheet of the present invention are suitable for a cover glass for a cellular phone, a digital camera, a PDA, or the like, or a glass substrate for a touch panel display or the like. Further, the tempered glass container of the present invention is suitable for a container for pharmaceuticals. In addition, the tempered glass and tempered glass sheet of the present invention can be expected to find use in applications requiring high mechanical strength, for example, a window glass, a substrate for a magnetic disk, a substrate for a flat panel display, a cover glass for a solar battery, a cover glass for a solid image pick-up element, and tableware, in addition to the above-mentioned applications.

REFERENCE SIGNS LIST 1 protective resin film
2 glass sheet to be tempered

The invention claimed is:
1. A tempered glass having a rectangular shape and having a compression stress layer in a surface thereof, a protective resin film being attached to at least one surface thereof,
  two parallel sides of the protective resin film protruding beyond the tempered glass, and the other two parallel sides of the protective resin film not protruding beyond the tempered glass,
  the tempered glass comprising as a glass composition, in terms of mol %, 50 to 80% of SiO$_2$, 5 to 30% of Al$_2$O$_3$, 0 to 2% of Li$_2$O, 5 to 25% of Na$_2$O, and 0 to 1.9% of K$_2$O, and being substantially free of As$_2$O$_3$, Sb$_2$O$_3$, PbO, and F.
2. The tempered glass according to claim 1, comprising as a glass composition, in terms of mol %, 50 to 80% of SiO$_2$, 6.5 to 12.4% of Al$_2$O$_3$, 0 to 1% of Li$_2$O, 9 to 15.5% of Na$_2$O, 0 to 1.9% of K$_2$O, 0.1 to 2.5% of MgO, and 0 to 2.5% of MgO+CaO+SrO+BaO, and being substantially free of As$_2$O$_3$, Sb$_2$O$_3$, PbO, and F.
3. The tempered glass according to claim 1, comprising as a glass composition, in terms of mol %, 50 to 80% of SiO$_2$, 6.5 to 12.4% of Al$_2$O$_3$, 0.01 to 15% of B$_2$O$_3$, 0 to 1% of Li$_2$O, 9 to 15.5% of Na$_2$O, 0 to 1.9% of K$_2$O, 9 to 16.5% of Li$_2$O+Na$_2$O+K$_2$O, 0.1 to 2.5% of MgO, and 0.1 to 2.5% of MgO+CaO+SrO+BaO, and being substantially free of As$_2$O$_3$, Sb$_2$O$_3$, PbO, and F.
4. The tempered glass according to claim 1, comprising as a glass composition, in terms of mol %, 50 to 77% of SiO$_2$, 6.5 to 12.4% of Al$_2$O$_3$, 1 to 15% of B$_2$O$_3$, 0 to 1% of Li$_2$O, 9 to 15.5% of Na$_2$O, 0 to 1.9% of K$_2$O, 9 to 16.5% of Li$_2$O+Na$_2$O+K$_2$O, 0.1 to 2.5% of MgO, 0.1 to 2.5% of MgO+CaO+SrO+BaO, and 13 to 18.5% of Li$_2$O+Na$_2$O+K$_2$O+MgO+CaO+SrO+BaO, and being substantially free of As$_2$O$_3$, Sb$_2$O$_3$, PbO, and F.
5. The tempered glass according to claim 1, comprising as a glass composition, in terms of mol %, 50 to 77% of SiO$_2$, 6.5 to 12.4% of Al$_2$O$_3$, 1 to 10% of B$_2$O$_3$, 0 to 1% of Li$_2$O, 9 to 15.5% of Na$_2$O, 0 to 1.9% of K$_2$O, 9 to 16.5% of Li$_2$O+Na$_2$O+K$_2$O, 0.1 to 2.5% of MgO, 0.1 to 2.5% of MgO+CaO+SrO+BaO, and 13 to 18.5% of Li$_2$O+Na$_2$O+K$_2$O+MgO+CaO+SrO+BaO, having a molar ratio MgO/(Li$_2$O+Na$_2$O+K$_2$O+MgO+CaO+SrO+BaO) of from 0.01 to 0.2, and being substantially free of As$_2$O$_3$, Sb$_2$O$_3$, PbO, and F.
6. The tempered glass according to claim 1, comprising as a glass composition, in terms of mol %, 50 to 77% of SiO$_2$, 6.5 to 12.4% of Al$_2$O$_3$, 1 to 10% of B$_2$O$_3$, 0 to 1% of Li$_2$O, 9 to 15.5% of Na$_2$O, 0 to 1.9% of K$_2$O, 9 to 16.5% of Li$_2$O+Na$_2$O+K$_2$O, 0.1 to 2.5% of MgO, 0.1 to 2.5% of MgO+CaO+SrO+BaO, and 13 to 18.5% of Li$_2$O+Na$_2$O+K$_2$O+MgO+CaO+SrO+BaO, having a molar ratio MgO/(Li$_2$O+Na$_2$O+K$_2$O+MgO+CaO+SrO+BaO) of from 0.01 to 0.2 and a molar ratio (Al$_2$O$_3$+B$_2$O$_3$)/SiO$_2$ of from 0.15 to 0.30, and being substantially free of As$_2$O$_3$, Sb$_2$O$_3$, PbO, and F.
7. The tempered glass according to claim 1, wherein the tempered glass has a density of 2.45 g/cm$^3$ or less.
8. The tempered glass according to claim 1, wherein when the tempered glass is immersed in a 10 mass % aqueous hydrochloric acid solution at 80° C. for 24 hours, a mass reduction, which is a value obtained by subtracting a mass of the tempered glass after the immersion from a mass of the tempered glass before the immersion and dividing a result of the subtraction by a surface area of the tempered glass before the immersion, is 40 mg/cm$^2$ or less.

9. The tempered glass according to claim 1, wherein a compression stress value of the compression stress layer is 300 MPa or more, and a thickness of the compression stress layer is 10 µm or more.

10. The tempered glass according to claim 1, wherein the tempered glass has a liquidus temperature of 1,200° C. or less.

11. The tempered glass according to claim 1, wherein the tempered glass has a liquidus viscosity of $10^{4.0}$ dPa·s or more.

12. The tempered glass according to claim 1, wherein the tempered glass has a temperature at $10^{4.0}$ dPa·s of 1,300° C. or less.

13. The tempered glass according to claim 1, wherein the tempered glass has a thermal expansion coefficient in a temperature range of from 30 to 380° C. of $90 \times 10^{-7}$/° C. or less.

14. A tempered glass sheet, comprising the tempered glass according to claim 1.

15. The tempered glass sheet according to claim 14, wherein the tempered glass sheet has a length dimension of 500 mm or more, a width dimension of 300 mm or more, and a thickness of from 0.1 to 2.0 mm.

16. The tempered glass sheet according to claim 14, wherein the tempered glass sheet is formed by an overflow down-draw method.

17. The tempered glass sheet according to claim 14, wherein the tempered glass sheet is used for a touch panel display.

18. The tempered glass sheet according to claim 14, wherein the tempered glass sheet is used for a cover glass for a cellular phone.

19. The tempered glass sheet according to claim 14, wherein the tempered glass sheet is used for a cover glass for a solar battery.

20. A tempered glass container, comprising the tempered glass according to claim 1.

21. A glass to be tempered having a rectangular shape, a protective resin film having a rectangular shape being attached to at least one surface thereof,
two parallel sides of the protective resin film protruding beyond the tempered glass, and the other two parallel sides of the protective resin film not protruding beyond the tempered glass,
the tempered glass sheet comprising as a glass composition, in terms of mol %, 50 to 77% of SiO$_2$, 6.5 to 12.4% of Al$_2$O$_3$, 1 to 10% of B$_2$O$_3$, 0 to 1% of Li$_2$O, 9 to 15.5% of Na$_2$O, 0 to 1.9% of K$_2$O, 9 to 16.5% of Li$_2$O+Na$_2$O+K$_2$O, 0.1 to 2.5% of MgO, 0.1 to 2.5% of MgO+CaO+SrO+BaO, and 13 to 18.5% of Li$_2$O+Na$_2$O±K$_2$O+MgO+CaO+SrO+BaO, having a molar ratio MgO/(Li$_2$O+Na$_2$O±K$_2$O+MgO+CaO+SrO+BaO) of from 0.01 to 0.2 and a molar ratio (Al$_2$O$_3$+B$_2$O$_3$)/SiO$_2$ of from 0.15 to 0.30, and being substantially free of As$_2$O$_3$, Sb$_2$O$_3$, PbO, and F,
the tempered glass sheet having a density of 2.45 g/cm$^3$ or less, a compression stress value of a compression stress layer of 300 MPa or more, a thickness of the compression stress layer of 10 µm or more, a liquidus temperature of 1,200° C. or less, and a thermal expansion coefficient in a temperature range of from 30 to 380° C. of $90 \times 10^{-7}$/° C. or less.

22. A glass to be tempered having a rectangular shape, a protective resin film having a rectangular shape being attached to at least one surface thereof,
two parallel sides of the protective resin film protruding beyond the tempered glass, and the other two parallel sides of the protective resin film not protruding beyond the tempered glass,
the glass comprising as a glass composition, in terms of mol %, 50 to 80% of SiO$_2$, 5 to 30% of Al$_2$O$_3$, 0 to 2% of Li$_2$O, 5 to 25% of Na$_2$O, and 0 to 1.9% of K$_2$O, and being substantially free of As$_2$O$_3$, Sb$_2$O$_3$, PbO, and F.

23. The glass to be tempered according to claim 22, wherein when the glass to be tempered is immersed in a 10 mass % aqueous hydrochloric acid solution at 80° C. for 24 hours, a mass reduction, which is a value obtained by subtracting a mass of the glass to be tempered after the immersion from a mass of the glass to be tempered before the immersion and dividing a result of the subtraction by a surface area of the glass to be tempered before the immersion, is 40 mg/cm$^2$ or less.

24. The glass to be tempered according to claim 22, wherein the glass to be tempered has a ratio CS$_2$/CS$_1$ of a compression stress value CS$_2$ to a compression stress value CS$_1$ of 0.7 or more, the compression stress value CS$_1$ being determined for a compression stress layer that is obtained by subjecting the glass to be tempered to ion exchange treatment in a potassium nitrate molten salt free of a history of being used, the compression stress value CS$_2$ being determined for a compression stress layer that is obtained by subjecting the glass to be tempered to ion exchange treatment in a potassium nitrate molten salt comprising 20,000 ppm by mass of Na ions.

* * * * *